(12) United States Patent
Huang et al.

(10) Patent No.: US 12,256,646 B2
(45) Date of Patent: Mar. 18, 2025

(54) MEMORY DEVICE AND METHOD OF FABRICATING THE SAME

(71) Applicant: Taiwan Semiconductor Manufacturing Company, Ltd., Hsinchu (TW)

(72) Inventors: Yen-Lin Huang, Menlo Park, CA (US); Ming-Yuan Song, Hsinchu (TW); Chien-Min Lee, Hsinchu County (TW); Nuo Xu, San Jose, CA (US); Shy-Jay Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 479 days.

(21) Appl. No.: 17/827,998

(22) Filed: May 30, 2022

(65) Prior Publication Data
US 2023/0389439 A1    Nov. 30, 2023

(51) Int. Cl.
| | |
|---|---|
| *H10N 50/10* | (2023.01) |
| *H01L 23/522* | (2006.01) |
| *H01L 23/528* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ......... *H10N 50/10* (2023.02); *H01L 23/5226* (2013.01); *H01L 23/5283* (2013.01); *H10B 61/22* (2023.02); *H10N 50/01* (2023.02); *H10N 50/80* (2023.02); *H10N 50/85* (2023.02)

(58) Field of Classification Search
CPC ........ H10N 50/10; H10N 50/01; H10N 50/80; H10N 50/85; H01L 23/5226; H01L 23/5283; H10B 61/22
See application file for complete search history.

(56) References Cited

U.S. PATENT DOCUMENTS 9,590,171 B2 *    3/2017    Lee .................. H10N 50/80

\* cited by examiner

*Primary Examiner* — David Vu
(74) *Attorney, Agent, or Firm* — JCIPRNET

(57) ABSTRACT

A memory device includes a substrate, a spin-orbit torque (SOT) layer, a magnetic tunneling junction (MTJ) film stack, a connecting via and a shielding structure. The SOT layer is disposed on the substrate. The MTJ film stack is formed over SOT layer and on the substrate. The connecting via is disposed on and electrically connected to the MTJ film stack. The shielding structure is laterally surrounding the MTJ film stack and disposed on the SOT layer, wherein the shielding structure includes a first dielectric layer, a high magnetic permeability layer and a second dielectric layer, the first dielectric layer is in contact with the SOT layer and the MTJ film stack, and the high magnetic permeability layer is sandwiched between the first dielectric layer and the second dielectric layer.

20 Claims, 21 Drawing Sheets

MEMORY DEVICE AND METHOD OF FABRICATING THE SAME

BACKGROUND

Magnetic random access memory (MRAM) is one of the leading candidates for next-generation memory technologies that aim to surpass the performance of various existing memories. MRAM offers comparable performance to volatile static random access memory (SRAM) and comparable density with lower power consumption to volatile dynamic random access memory (DRAM). As compared to non-volatile flash memory, MRAM offers much faster access speed and suffers minimal degradation over time. Spin orbit torque MRAM (SOT-MRAM) is a type of MRAM. As compared to spin transfer torque MRAM (STT-MRAM), which is another type of MRAM, SOT-MRAM offers better performance in terms of speed and endurance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
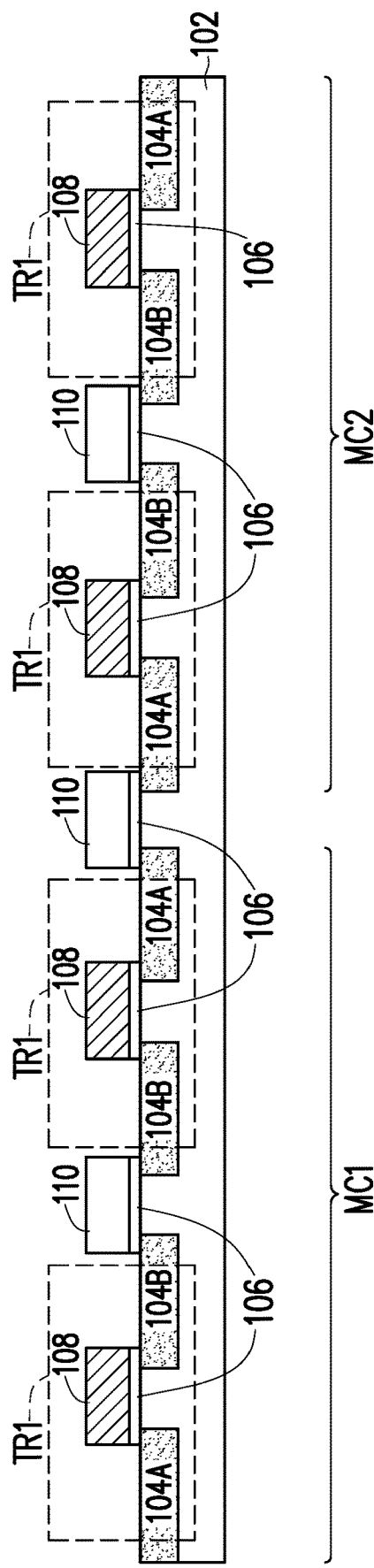
FIG. 1 to FIG. 18 are schematic sectional views and top views of various stages in a method of fabricating a memory device according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 18 are schematic sectional views and top views of various stages in a method of fabricating a memory device according to some exemplary embodiments of the present disclosure. Referring to FIG. 1, in some embodiments, a substrate 102 is provided. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

In some embodiments, multiple transistors TR1 are formed on the substrate 102. For example, the transistors TR1 are planar field effect transistor (FET), Fin Field-Effect Transistors (FinFETs). In some other embodiments, the transistors TR1 may be alternatively formed as gate-all-around (GAA) transistors. In some embodiments, when the transistors TR1 are FinFETs, then the substrate 102 may include multiple fins (not shown) formed thereon. The transistors TR1 are either belonging to a first memory cell MC1 or a second memory cell MC2 of a memory device, and are used for read or write operations. The first memory cell MC1 and the second memory cell MC2 are for example, magnetic random-access memory (MRAM) cells, or spin orbit torque (SOT) MRAM cells.

As illustrated in FIG. 1, the transistors TR1 include source regions 104A, drain regions 104B, gate dielectric layers 106 and gate electrodes 108. The source regions 104A and the drain regions 104B are formed in the substrate 102 on either side of the gate electrode 108 (or word lines). For example, the source regions 104A and the drain regions 104B are implanted regions of the substrate 102, or epitaxial material grown in recesses formed in the substrate 102. In some embodiments, spacers (not shown in the Figures) may be disposed on the sidewalls of the gate electrodes 108. In some embodiments, dummy gate electrodes 110 (or dummy word lines) may be formed between some of the gate electrodes 108 to improve process uniformity. The dummy gate electrodes 110 may be disposed on the gate dielectric layers 106, and may be considered as "dummy transistors" or "dummy FinFETs". By disposing the dummy gate electrodes 110, a parasitic transistor may be formed between the transistors TR1 of the memory cells (MC1, MC2). The parasitic transistor may be structurally identical with the transistors TR1, and the transistors may share one of its source/drain terminals with the parasitic transistor. In some embodiments, the dummy gate electrodes 110 is configured to receive a gate voltage that can ensure an off state of the parasitic transistor, thus the interference between the transistors TR1 of the memory cells (MC1, MC2) can be effectively avoided. Accordingly, the parasitic transistor including the dummy gate electrodes 110 may also be referred as an isolation transistor.

Figure 2:
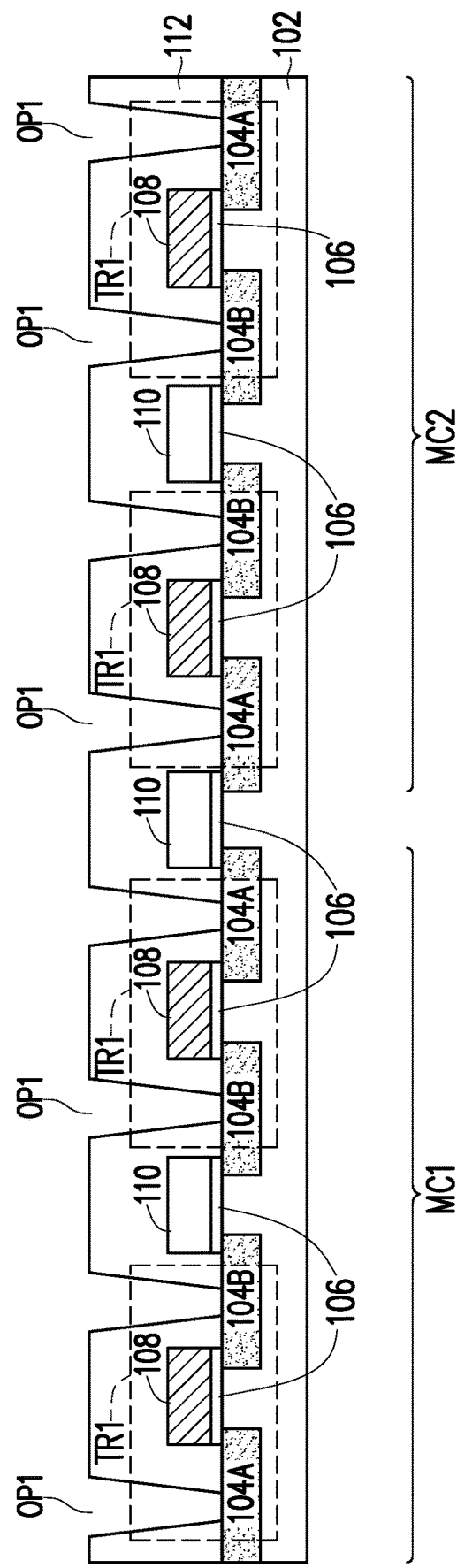

Referring to FIG. 2, in some embodiments, a dielectric layer 112 is formed over the substrate 102, and patterned to form openings OP1. The dielectric layer 112 may be patterned using a suitable photolithography and etching process to form the openings OP1. For example, the openings OP1 expose top surfaces of the source regions 104A and the drain regions 104B. In some embodiments, the dielectric layer 112 covers the gate dielectric layers 106, the gate electrode 108 and the dummy gate electrodes 110. The dielectric layer 112 may be formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof. The dielectric layer 112 may be formed using any acceptable deposition process, such as spin coating, physical vapor deposition (PVD), chemical vapor deposition (CVD), the like, or a combination thereof. In some embodiments, the dielectric layer 112 may be a low-k dielectric material, such as a dielectric material having a dielectric constant (k value) lower than about 3.0, for example.

Figure 3:
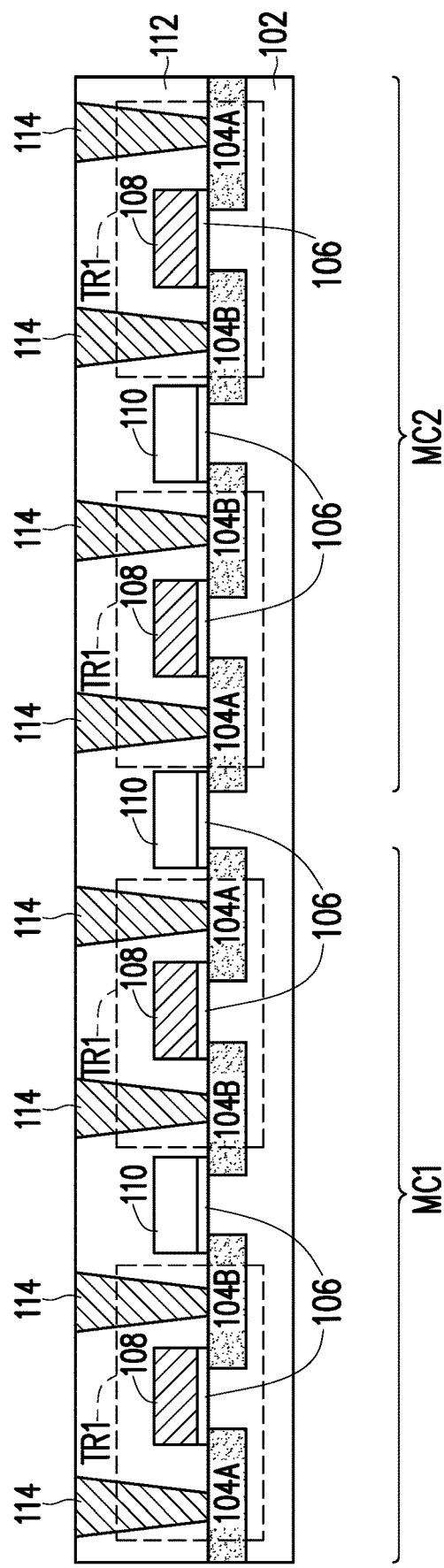

Referring to FIG. 3, in a subsequent step, a plurality of conductive vias 114 (or contact plugs) are formed in the openings OP1 to make electrical connection to the source regions 104A and the drain regions 104B. In some embodiments, the conductive vias 114 are formed by depositing a barrier layer (not shown) extending into the openings OP1, then depositing a conductive material over the barrier layer. Subsequently, a planarization process such as a chemical mechanical polishing (CMP) process or a grinding process may be performed to remove excess portions of the blanket conductive barrier layer and the conductive material. The barrier layer or the conductive material of the conductive vias 114 may be formed using a suitable process such as chemical vapor deposition (CVD), physical vapor deposition (PVD), atomic layer deposition (ALD), plating, or the like. The barrier layer, if used, may be formed of any suitable material, such as TiN, Ti, TaN, Ta, the like, or combinations thereof.

Figure 4:
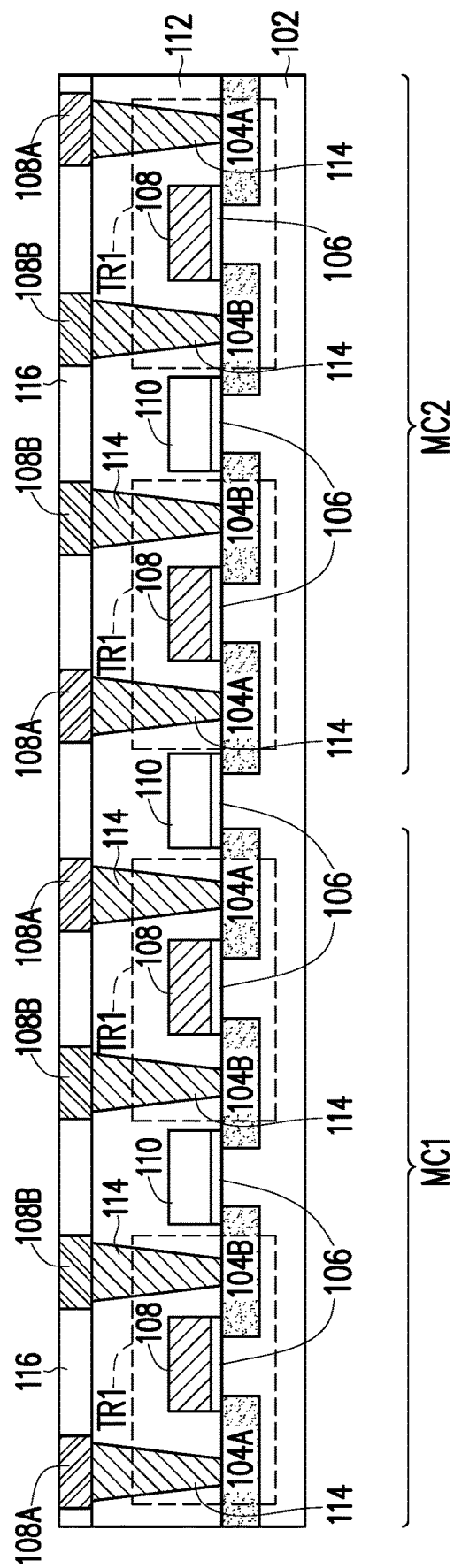

Referring to FIG. 4, in some embodiments, a dielectric layer 116 as well as conductive lines 108A (e.g. source lines) and landing pads 108B are formed over the dielectric layer 112. The dielectric layer 112 is laterally surrounding the conductive lines 108A and the landing pads 108B. In some embodiments, the conductive lines 108A are connected to the source regions 104A of the transistors TR1 through the conductive vias 114, while the landing pads 108B are connected to the drain regions 104B of the transistors TR1 through the conductive vias 114. In some embodiments, the dielectric layer 116 may be formed of the same material and formed by a similar method to that of the dielectric layer 112. Therefore, its detailed description will be omitted herein.

In some embodiments the conductive lines 108A and the landing pads 108B are formed using a suitable technique such as damascene, dual-damascene, plating, deposition, the like, or combinations thereof. In some embodiments, the conductive lines 108A and the landing pads 108B may be formed by patterning the dielectric layer 116 to form openings (not shown), and then filling the openings in the dielectric layer 116 with conductive material. In some embodiments, the conductive lines 108A and the landing pads 108B may be formed of the same material and formed by a similar method to that of the conductive vias 114. Therefore, its detailed description will be omitted herein.

Figure 5:
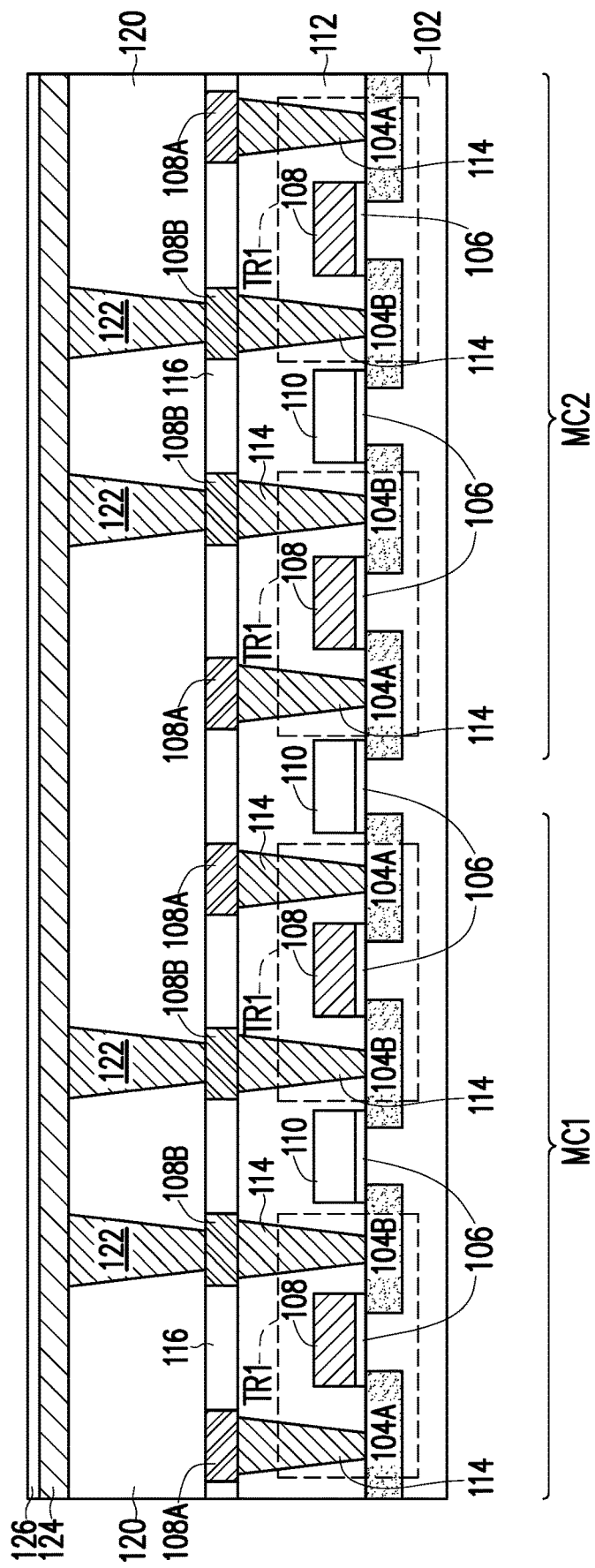

Referring to FIG. 5, in a subsequent step, a dielectric layer 120 is formed over the dielectric layer 116, and conductive vias 122 are formed in the dielectric layer 120. In some embodiments, the conductive vias 122 penetrate through the dielectric layer 120 to establish electrical connection with the landing pads 108B. In other words, the conductive vias 122 are electrically connected to the transistors TR1 through the landing pads 108B and conductive vias 114. The materials of the dielectric layer 120 and materials of the conductive vias 122 may be similar to the materials of the dielectric layer 112 and materials of the conductive vias 114, and may be made by similar methods. Therefore, the details of the dielectric layer 120 and the conductive vias 122 will be omitted herein.

As further illustrated in FIG. 5, a spin-orbit torque (SOT) layer 124 and a spacer layer 126 is formed over the dielectric layer 120. For example, the SOT layer 124 is globally formed on the dielectric layer 120 and is connected to the conductive vias 122. In some embodiments, the SOT layer 124 includes one or more heavy metals or materials doped by heavy metals. In certain embodiments, platinum (Pt), α-tungsten (α-W), β-tungsten (β-W), β-tantalum (β-Ta), gold-platinum (AuPt), $W_3Ta$, $Bi_xSe_y$, BiSeTe, multi-layers thereof, alloys thereof, the like, or combinations thereof is used for the material of the SOT layer 124. In some embodiments, the method for forming the SOT layer 124 may include a sputtering process or a co-sputtering process, and may include a subsequent thermal treatment. In some embodiments, the thermal treatment is an annealing process. In some embodiments, the process temperature of the thermal treatment ranges from about 350° C. to about 450° C., and the process time of the thermal treatment ranges from about 10 minutes to about 60 minutes.

In some embodiments, the spacer layer 126 may be formed over a top surface of the SOT layer 124. The spacer layer 126 may be formed from a metal material or a dielectric material, such as a metal oxide. Where the spacer layer 126 is formed from a metal material, the spacer layer 126 may be formed of a metal material such as W, Ru, Pt, Mo, Ti, Mg, the like, or combinations thereof. Where the spacer layer 126 is formed form a dielectric material, the spacer layer 126 may be formed of a dielectric material such as magnesium oxide ($MgO_x$), cobalt oxide ($CoO_x$), aluminum oxide ($AlO_x$), the like, or combinations thereof. In some embodiments, the spacer layer 126 may be formed from multiple layers which each may be a different material, including a metal material and/or a dielectric material.

Figure 6:
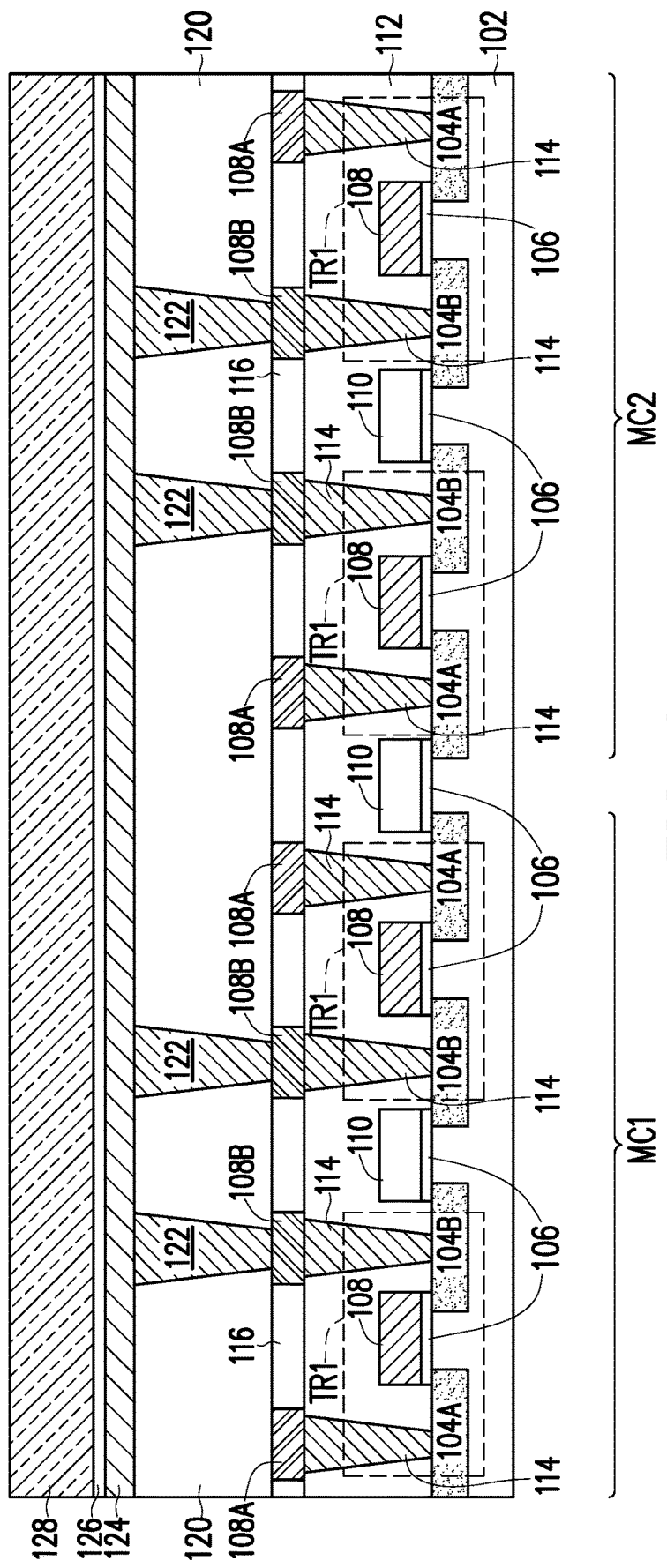

Referring to FIG. 6, in a subsequent step, a magnetic tunneling junction (MTJ) film stack 128 is formed on the spacer layer 126. In some embodiments, the forming of the magnetic tunneling junction (MTJ) film stack 128 may include sequentially forming a free layer, a barrier layer, a reference layer (or ferromagnetic layer), a synthetic anti-ferromagnetic (SAF) layer (or pinned layer), a capping layer and a top electrode over the spacer layer 126. For example, the free layer of the MTJ film stack 128 may be contacting the spacer layer 126, whereas the top electrode is the top-most layer of the MTJ film stack 128. However, the MTJ film stack 128 may also include other configurations. In some embodiments, forming the MTJ film stack 128 includes multiple deposition processes, and each deposition process includes a sputtering process, a co-sputtering process or combinations thereof.

In some embodiments, the MTJ film stack 128 is used as a storage element. For example, magnetization orientations of ferromagnetic layers in the MTJ film stack 128 may determine an electrical resistance of the MTJ film stack 128. The MTJ film stack 128 may have a low electrical resistance state when the magnetization orientations are at a parallel state, and have a high electrical resistance state when the magnetization orientations are at an anti-parallel state. By altering the magnetization orientations in the MTJ film stack 128, the MTJ film stack 128 can be programmed to store complementary logic sates (e.g., a logic high state indicating the high electrical resistance state and a logic low state indicating the low electrical resistance state).

Figure 7:
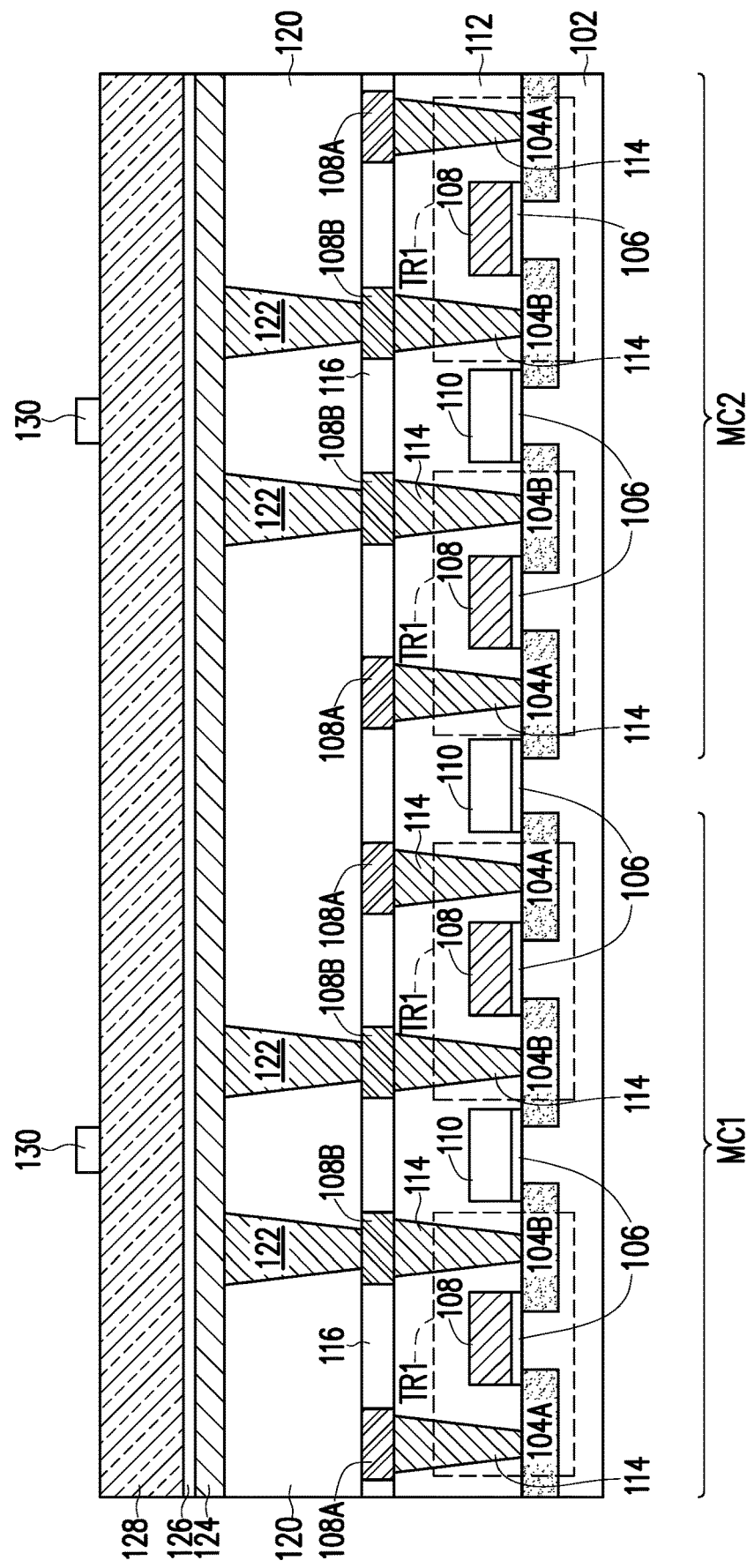

Referring to FIG. 7, in some embodiments, a hard mask layer 130 is formed over the top electrode of the MTJ film stack 128. The hard mask layer 130 is used as a mask to pattern the various films of the MTJ film stack 128. In some embodiments, the hard mask layer 130 is disposed in the first memory cell MC1 and the second memory cell MC2 of the memory device. In some embodiments, the hard mask layer 130 is a metal hard mask made of materials such as TiN, TaN, or the like. However, the disclosure is not limited thereto. In some alternative embodiments, the hard mask layer 130 is an inorganic dielectric material, such as SiON, SiN, SiC, SiOC, SiCN, or a combination thereof. The hard mask layer 130 may be formed by any suitable method, such as chemical vapor deposition (CVD), physical vapor deposition (PVD), or the like.

Figure 8:
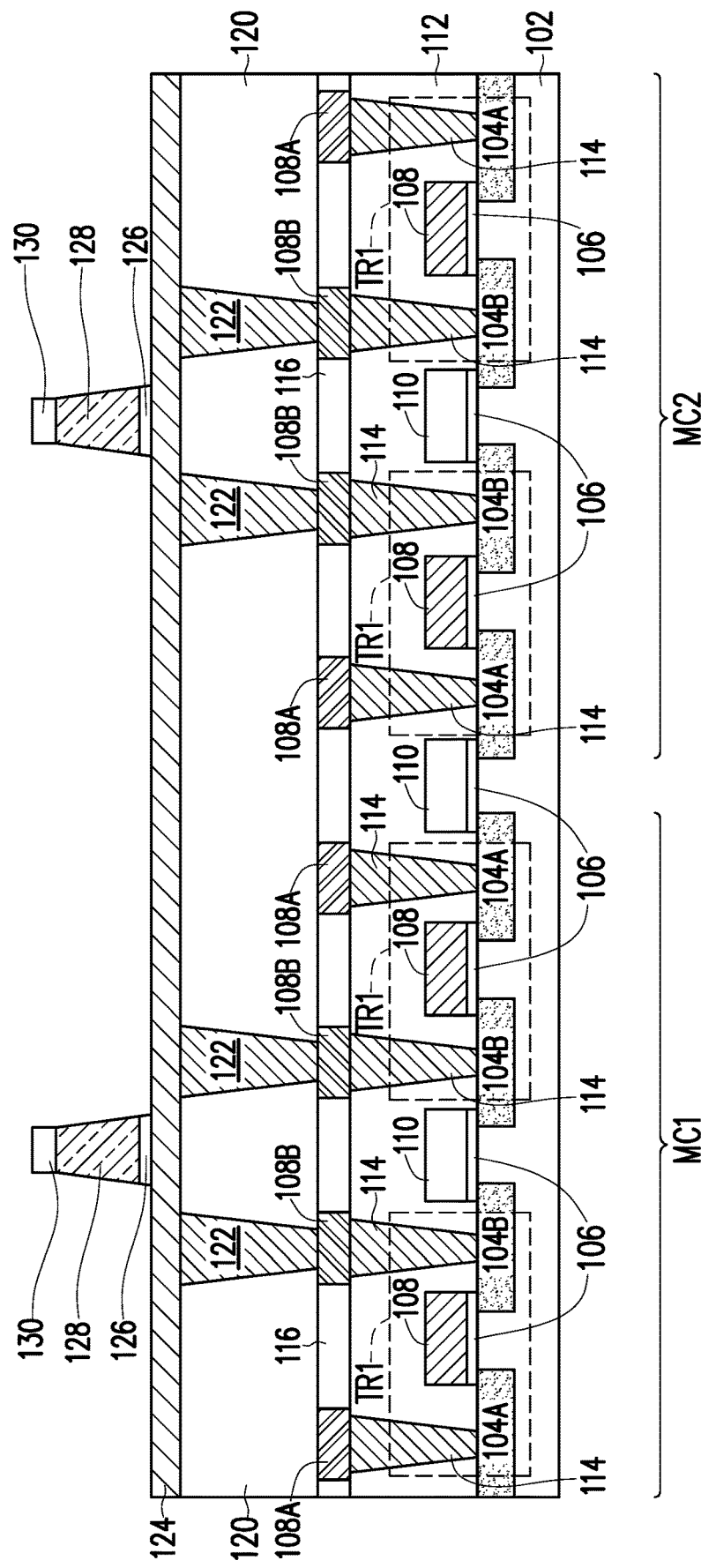

Subsequently, referring to FIG. 8, the MTJ film stack 128 along with the spacer layer 126 are patterned by using the hard mask layer 130 as a mask. After the patterning step, the MTJ film stack 128 and the spacer layer 126 have a tapered (mesa) shape, and are arranged in each of the memory cells (MC1 and MC2). For example, sidewalls of the MTJ film stack 128 may be aligned with sidewalls of the spacer layer 126.

Figure 9:
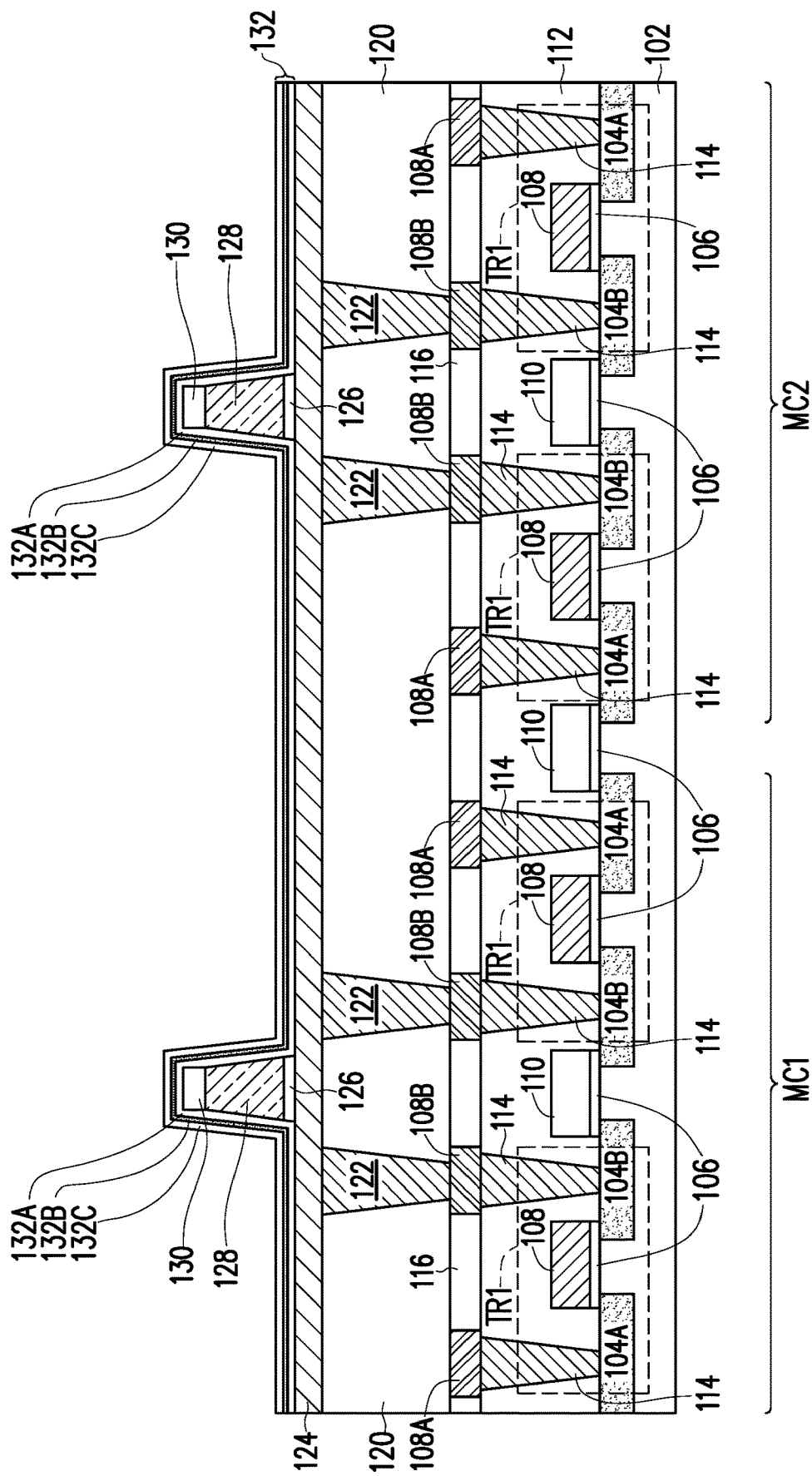

Referring to FIG. 9, in a subsequent step, a shielding layer 132 is formed on the SOT layer 124 and over the spacer layer 126, the MTJ film stack 128 and the hard mask layer 130. In some embodiments, the shielding layer 132 laterally surrounds the spacer layer 126, the MTJ film stack 128 and the hard mask layer 130. In some embodiments, forming the shielding layer 132 includes forming a first dielectric layer 132A, a high magnetic permeability layer 132B and a second dielectric layer 132C in sequence. For example, the first dielectric layer 132A is in contact with the SOT layer 124 and the MTJ film stack 128, and the high magnetic permeability layer 132B is sandwiched between the first dielectric layer 132A and the second dielectric layer 132C.

In some embodiments, the first dielectric layer 132A is disposed on the SOT layer 124 and laterally surrounding and covering the spacer layer 126, the MTJ film stack 128 and the hard mask layer 130. In certain embodiments, the high magnetic permeability layer 132B is disposed on the first dielectric layer 132A and laterally surrounding the first dielectric layer 132A, the spacer layer 126, the MTJ film stack 128 and the hard mask layer 130. Furthermore, the second dielectric layer 132C is disposed on the high magnetic permeability layer 132B and laterally surrounding the high magnetic permeability layer 132B, the first dielectric layer 132A, the MTJ film stack 128 and the hard mask layer 130.

In some embodiments, the first dielectric layer 132A and the second dielectric layer 132C are made of dielectric materials such as silicon carbide, silicon oxycarbide, silicon oxide, silicon oxynitride, silicon carboxynitride, other suitable dielectric materials, or the like. Furthermore, the high magnetic permeability layer 132B is a material having high magnetic permeability, such as a material selected from the group consisting of Fe, $Ni_{0.8}Fe_{0.2}$, $Ni_{0.77}Fe_{0.16}Co_{0.05}Mo_{0.02}$, $Ni_{0.77}Fe_{0.16}Co_{0.005}Cr_{0.02}$, and $Co_{1-x}Fe_x$, and wherein $0.05<x<0.95$. Furthermore, the first dielectric layer 132A, the second dielectric layer 132C and the high magnetic permeability layer 132B may be formed by suitable deposition process, such as spin coating, physical vapor deposition (PVD), chemical vapor deposition (CVD), the like, or a combination thereof.

Figure 10:
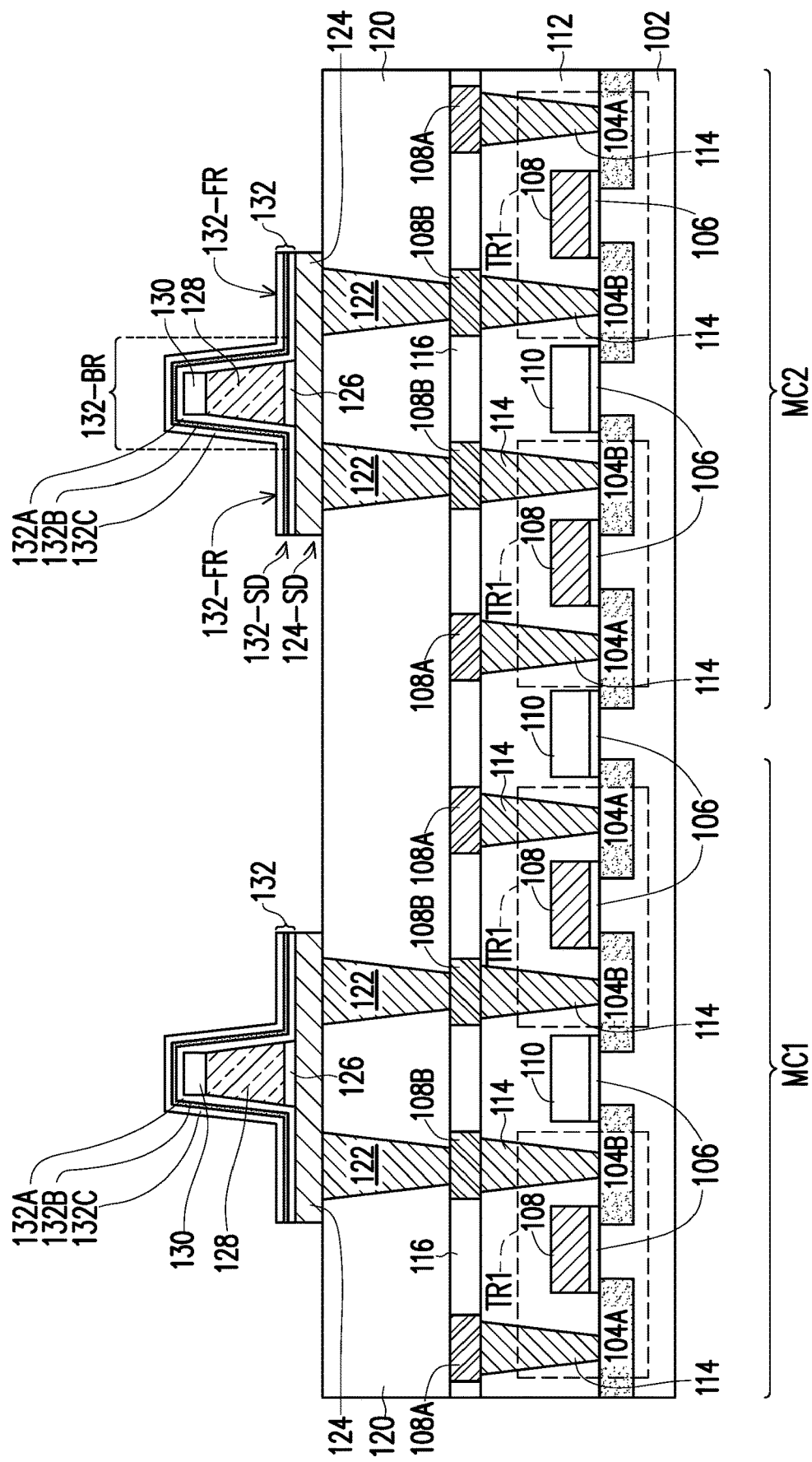
Figure 11:
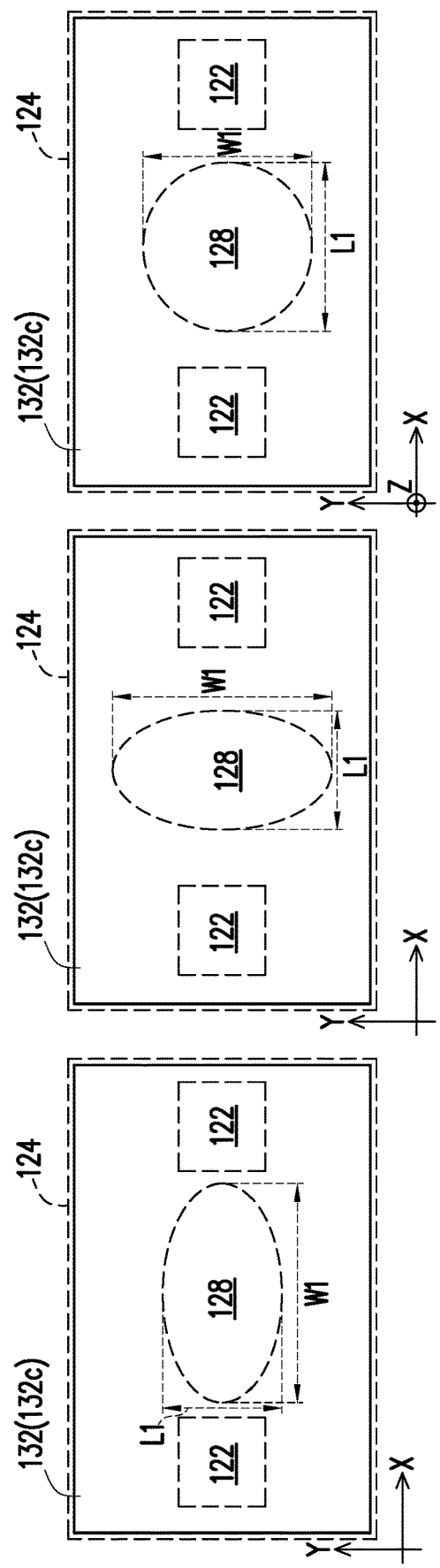

Referring to FIG. 10, in a subsequent step, the shielding structure 132 and the SOT layer 124 are patterned together so that sidewalls 124-SD of the SOT layer 124 are aligned with sidewalls 132-SD of the shielding structure 132. For example, the sidewalls 124-SD of the SOT layer 124 may be aligned with sidewalls of the first dielectric layer 132A, the high magnetic permeability layer 132B and the second dielectric layer 132C. In some embodiments, the shielding structure 132 includes a barrier portion 132-BR and a flank portion 132-FR. For example, the barrier portion 132-BR is covering sidewalls and tops of the MTJ film stack 128, and the flank portion 132-FR is connected to the barrier portion 132-BR, and extends from the barrier portion 132-BR towards sidewalls 124-SD of the SOT layer 124. In other words, the sidewalls of the flank portion 132-FR are aligned with the sidewalls 124-SD of the SOT layer 124. By using the shielding structure 132 to laterally surround the MTJ film stack 128, the shielding structure 132 can sustain external magnetic field over 1,000 Oe (oersted), which leaves a relatively small magnetic field of less than 100 Oe in the cell space of the MTJ film stack 128.

FIG. 11A to FIG. 11C are top views of the shielding structure 132 covering the MTJ film stack 128 and the conductive vias 122 shown in FIG. 10 in accordance with various embodiments. In the above embodiments, the shielding structure 132 is standing on the SOT layer 124 and have substantially the same top view profile with the SOT layer 124. Referring to FIG. 11A, in one embodiment, the major axis of the MTJ film stack 128 is substantially aligned or substantially parallel with the major axis of the shielding structure 132, and the major axis of the SOT layer 124, along which the write path is directed. For example, the major axis of the SOT layer 124 and the directed write path between the conductive vias 122 are along the direction X (i.e., an in-plane direction), and the major axis of the MTJ film stack 128 as well as the magnetization direction of the free layer in the MTJ film stack 128 are along the direction X as well. The ratio of the dimension W1 of the MTJ film stack 128 along the direction X over the dimension L1 of the MTJ film stack 128 along the direction Y (i.e., another in-plane direction) may, for example, range from about 1.5 to about 5.

Referring to FIG. 11B, in some other embodiments, the major axis of the MTJ film stack 128 is intersected with (e.g., perpendicular with) the major axis of the SOT layer 124, along which the write path is directed. For example, the major axis of the SOT layer 124 and the directed write path between the conductive vias 122 are along the direction X, while the major axis of the MTJ film stack 128 as well as the magnetization direction of the free layer in the MTJ film stack 128 are along the direction Y. The ratio of the dimension W1 of the MTJ film stack 128 along the direction Y over the dimension L1 of the MTJ film stack 128 along the direction X may, for example, range from about 1.5 to about 5.

Referring to FIG. 11C, in another embodiment, the MTJ film stack 128 is formed in a substantially symmetrical shape. In such embodiment, the magnetization direction of the free layer in the MTJ film stack 128 may be along the direction Z (i.e., an out-of-plane direction) that is substantially normal to the surface of the SOT layer 124 facing the MTJ film stack 128. In addition, the ratio of the dimension L1 of the MTJ film stack 128 along the direction X over the dimension W1 of the MTJ film stack 128 along the direction Y may be close to or identical with 1.

It should be noted that, the MTJ film stack 128 is exemplarily taken for elaborating various configurations of the SOT layer 124 and a MTJ film stack 128 standing on the SOT layer 124. The SOT layer 124 and the MTJ film stack 128 as described with reference to FIG. 10 may have the variations shown in FIG. 11A through FIG. 11C as well.

Figure 12:
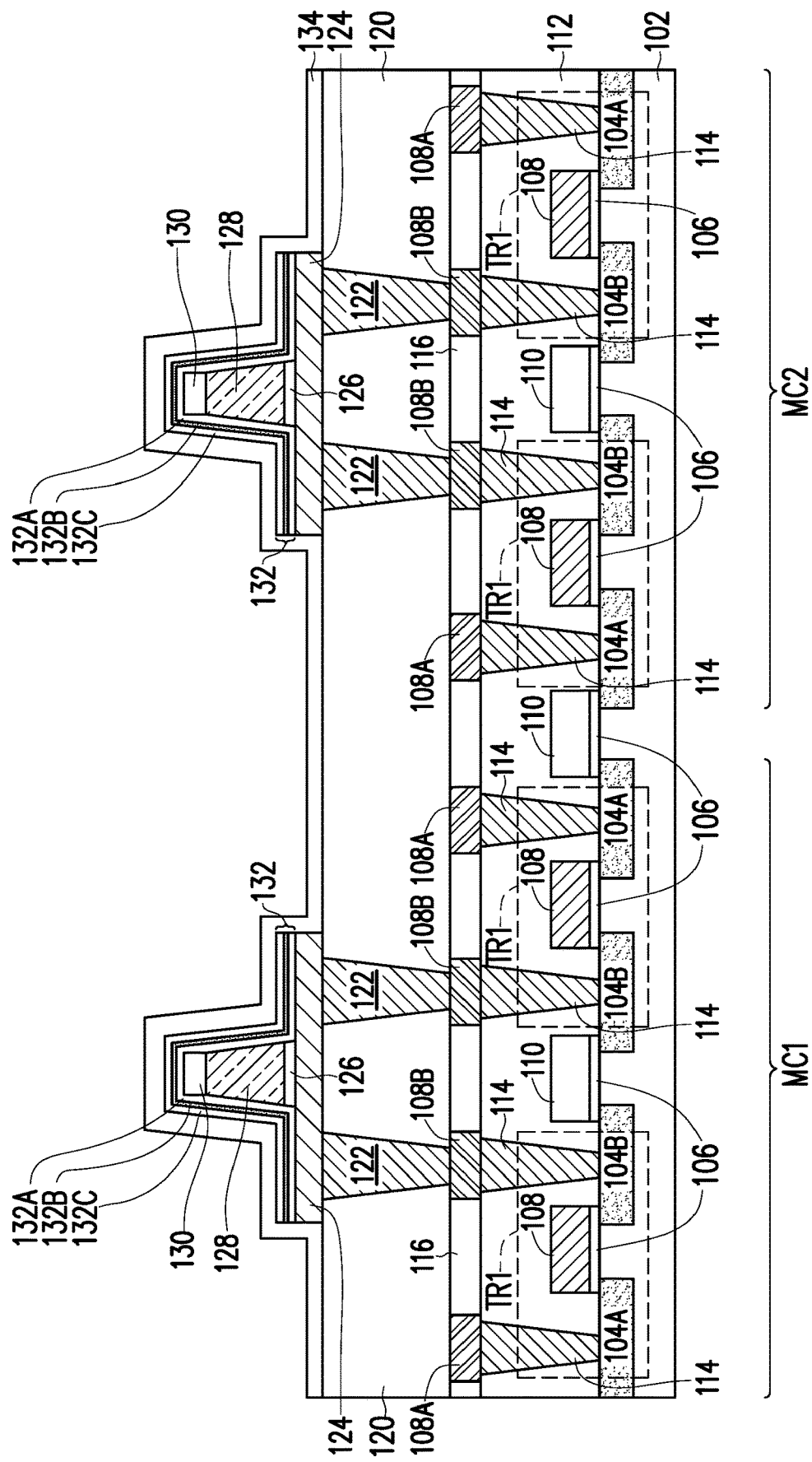

Referring to FIG. 12, in some embodiments, a dielectric layer 134 (or interlayer dielectric) is conformally formed over the dielectric layer 120 and over the SOT layer 124 and the shielding layer 132. For example, the dielectric layer 134 laterally surrounds the SOT layer 124 and the shielding layer 132. In some embodiments, the dielectric layer 134 are formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof. In addition, the method for forming the dielectric layer 134 includes a deposition process, such as a chemical vapor deposition (CVD) process, or the like.

Figure 13:
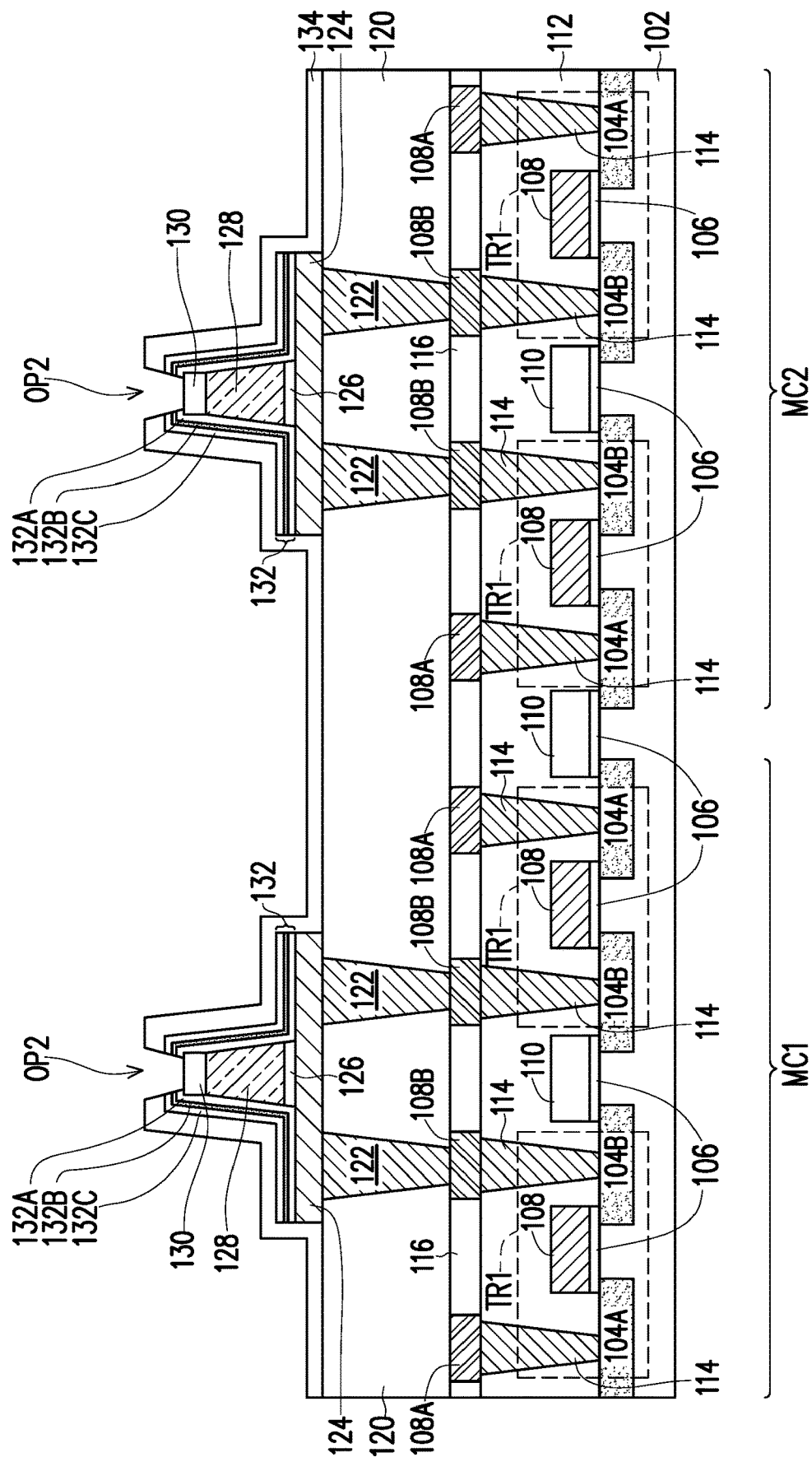
Figure 14:
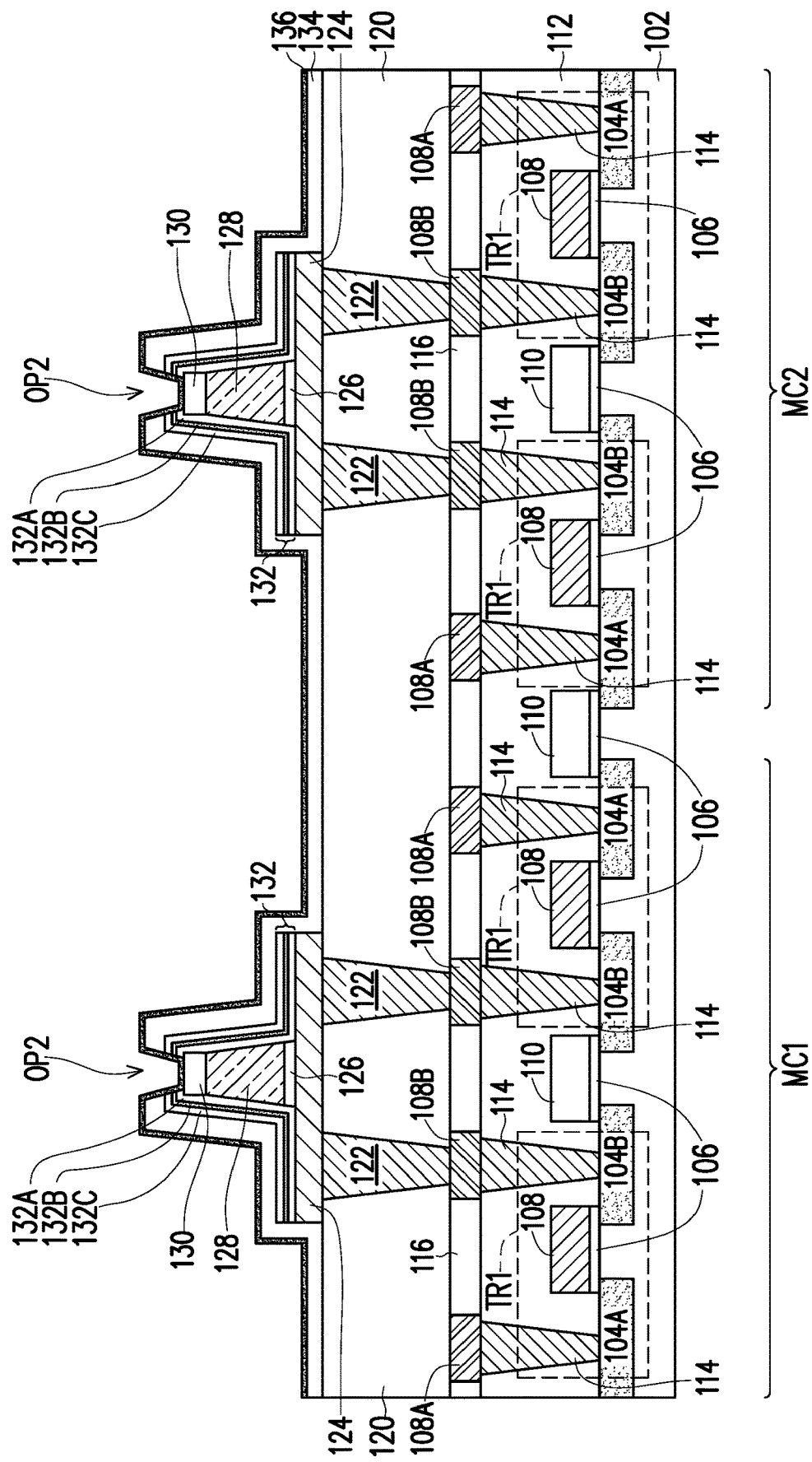

Referring to FIG. 13, in a subsequent step, the dielectric layer 134 and the shielding layer 132 are patterned together to form openings OP2 revealing the hard mask layer 130. In other words, the openings OP2 are formed over and overlapped with the MTJ film stack 128. In some embodiments, portions of the shielding layer 132 are removed so that the first dielectric layer 132A of the shielding structure 132 is still covering and contacting sidewalls of the spacer layer 126, sidewalls of the MTJ film stack 128 and sidewalls of the hard mask layer 130, while the first dielectric layer 132A is covering and contacting a top surface of the hard mask layer 130. Referring to FIG. 14, in some embodiments, a spacer material 136 may be conformally formed over the dielectric layer 134 and within the openings OP2. For example, the spacer material 136 is in physical contact with the hard mask layer 130, and is in physical contact with the first dielectric layer 132A, the high magnetic permeability layer 132B and the second dielectric layer 132C. The spacer material 136 may be formed of materials such as silicon carbide, silicon oxycarbide, silicon oxide, silicon oxynitride, silicon carboxynitride, other suitable dielectric materials, or the like. In addition, the method for forming the spacer material 136 includes a deposition process, such as a chemical vapor deposition (CVD) process, or the like.

Figure 15:
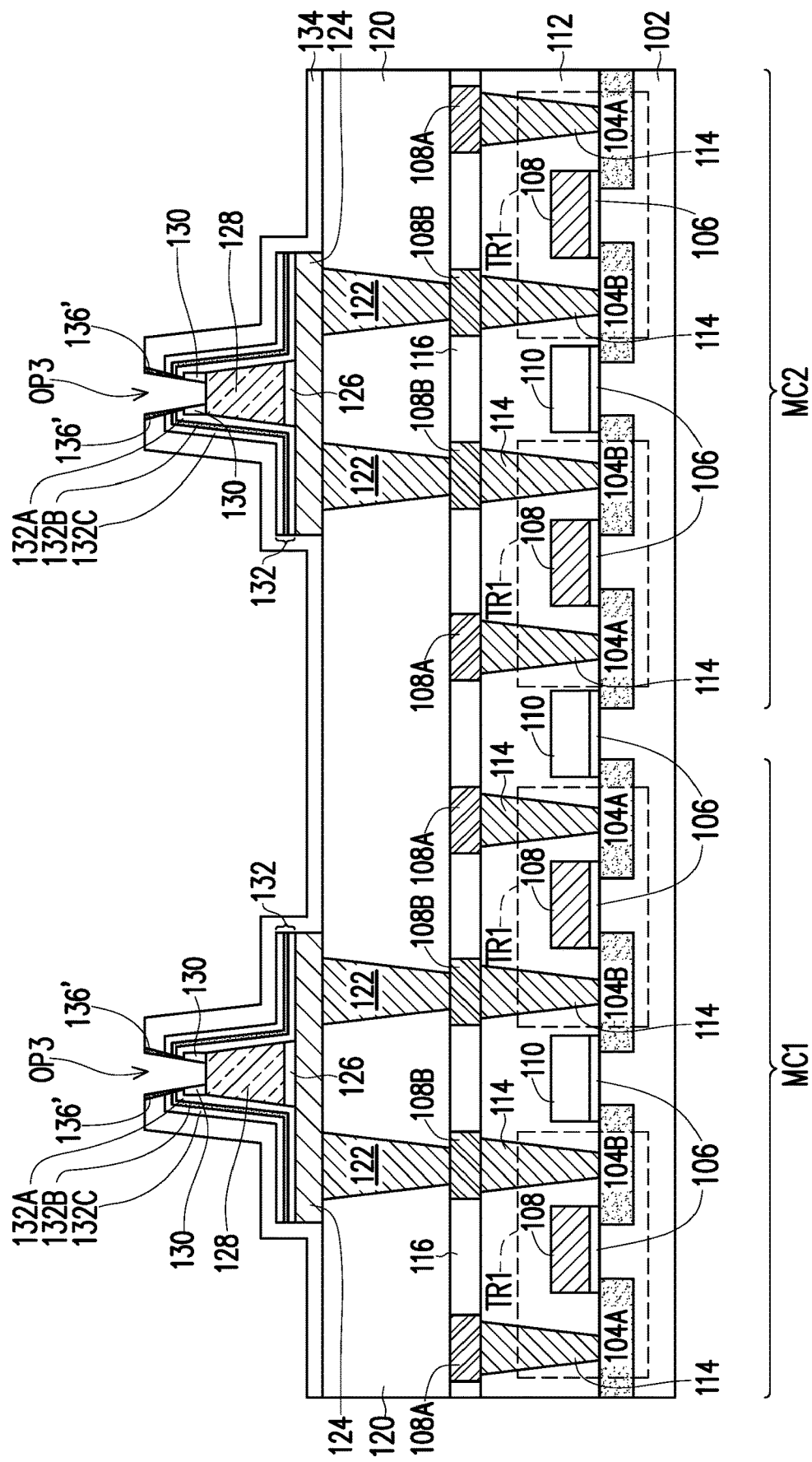

Referring to FIG. 15, after forming the spacer material 136, the spacer material 136 is patterned to form a spacer structure 136'. For example, the spacer material 136 located on the top surface of the dielectric layer 134 is removed to form the spacer structure 136', and a portion of the hard mask layer 130 may be further removed to form openings OP3. In some embodiments, the spacer material 136 is patterned along with the hard mask layer 130 so that sidewalls (inner sidewalls) of the spacer structure 136' are aligned with sidewalls (inner sidewalls) of the hard mask layer 130. In certain embodiments, the openings OP3 partially reveal a top surface of the MTJ film stack 128.

Figure 16:
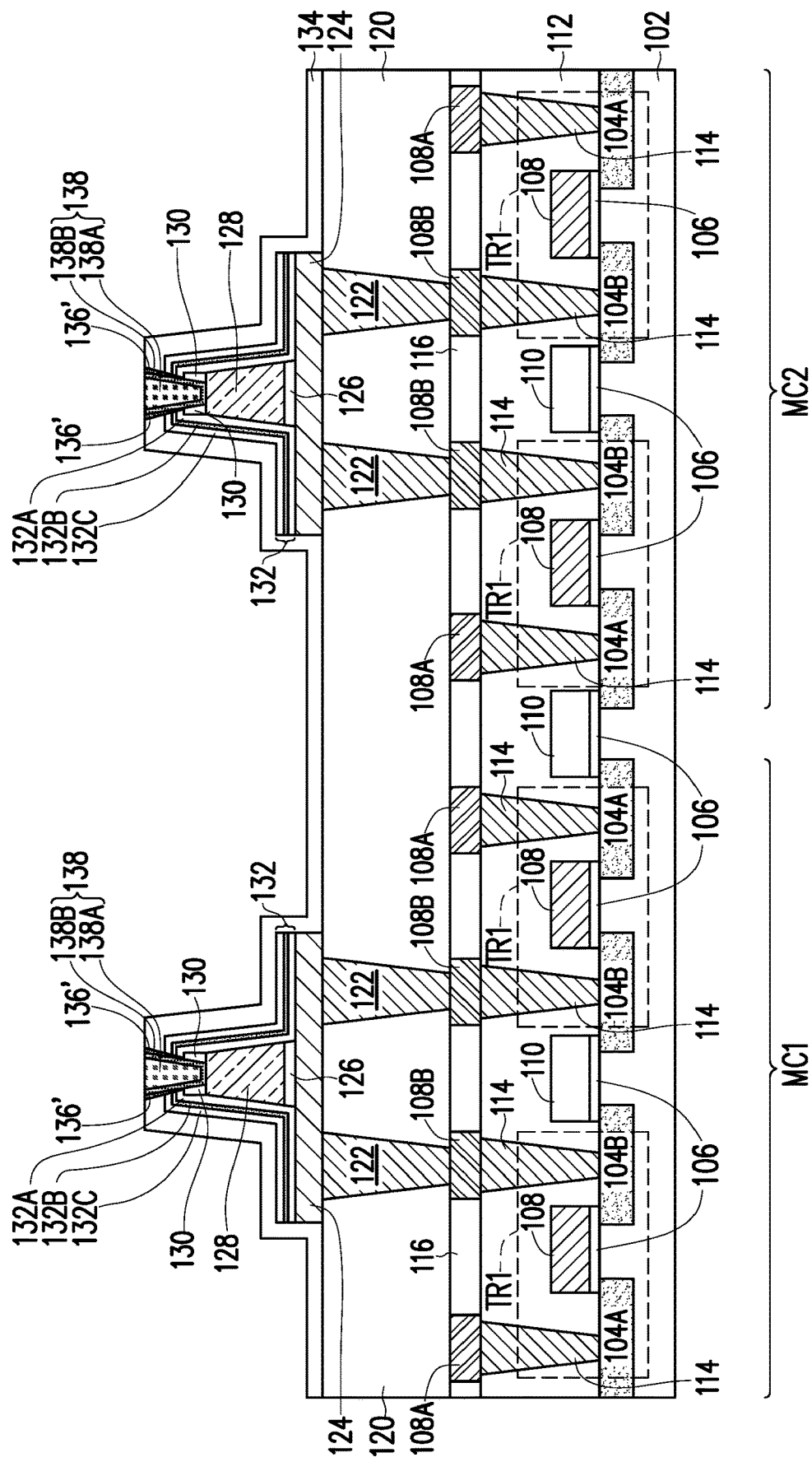

Referring to FIG. 16, in a subsequent step, connecting vias 138 are formed in the openings OP3 so that they are electrically connected to the MTJ film stack 128. In some embodiments, forming the connecting vias 138 include forming a barrier layer 138A and a conductive body 138B on the barrier layer 138A. For example, in one embodiment, the barrier layer 138A is cobalt and the conductive body 138B is copper. However, the disclosure is not limited thereto, and other suitable materials may be used as the barrier layer 138A and the conductive body 138B. After forming the connecting vias 138 in the openings OP3, the shielding structure 132 is partially surrounding the connecting vias 138, and the spacer structure 136' may be arranged in between the shielding structure 132 and the connecting vias 138. In some embodiments, the spacer structure 136' is covering and contacting sidewalls of the connecting vias 138 (or sidewalls of the barrier layer 138A). Furthermore, the first dielectric layer 138A, the high magnetic permeability layer 138B and the second dielectric layer 138C of the shielding structure 138 and the dielectric layer 134 are contacting sidewalls of the spacer structure 136'.

Figure 17:
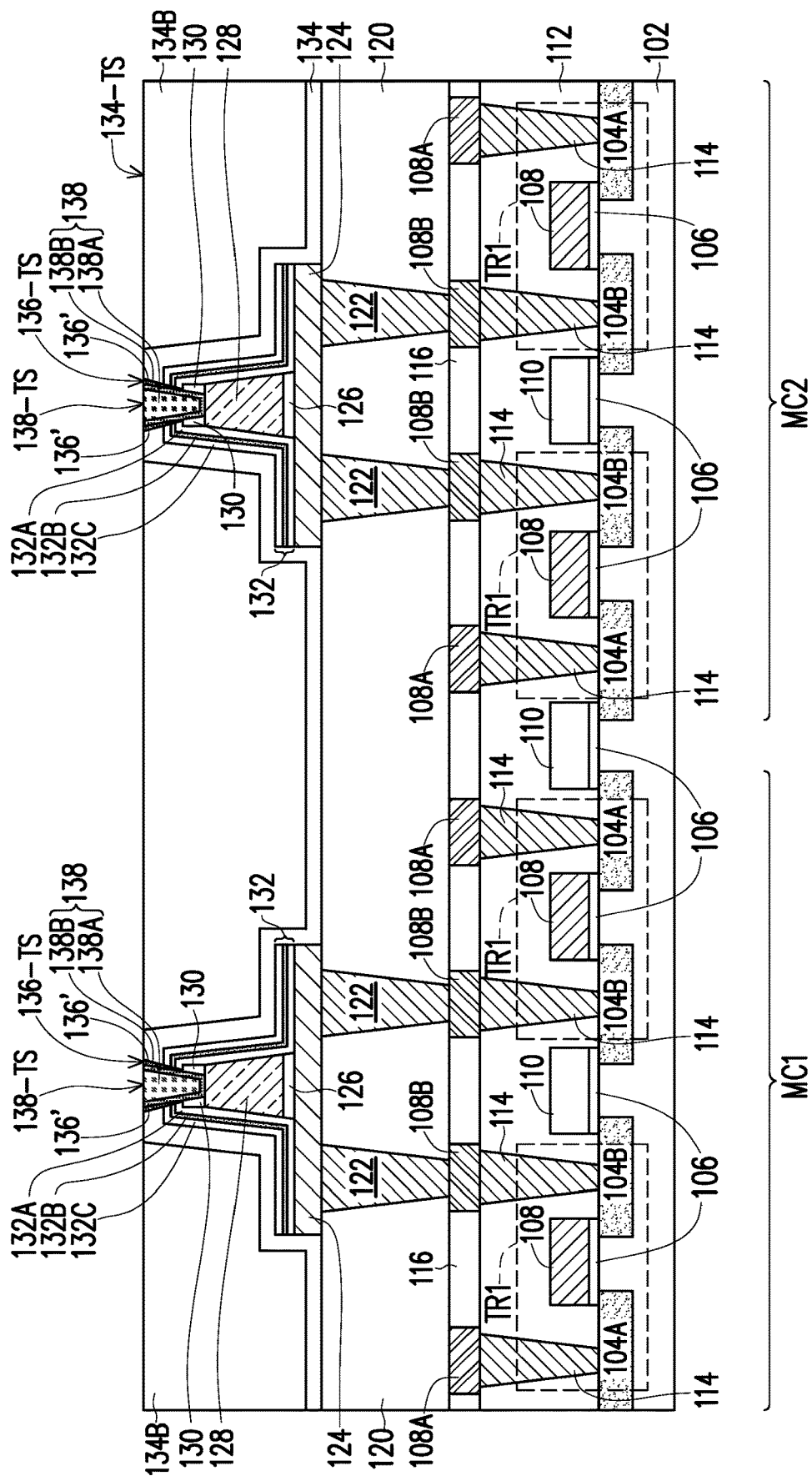

Referring to FIG. 17, in some embodiments, a dielectric layer 134B (or interlayer dielectric) is formed over the dielectric layer 134 to surround the SOT layer 124 and the shielding layer 132. In some embodiments, the dielectric layer 134B are formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof. In addition, the method for forming the dielectric layer 134B includes a deposition process, such as a chemical vapor deposition (CVD) process, or the like.

The dielectric layer 134 and the dielectric layer 134B may be collectively referred as an interlayer dielectric. For example, the interlayer dielectric (134, 134B) is surrounding the SOT layer 124, the MTJ film stack 128, the shielding structure 132, the hard mask layer 130 and the connecting vias 138. In certain embodiments, after forming the dielectric layer 134B a planarization process such as a chemical mechanical polishing (CMP) process or a grinding process may be performed to remove excess portions of the dielectric layer 134B. For example, after the planarization process, a top surface 134-TS of the interlayer dielectric (134, 134B) is substantially aligned and coplanar with a top surface 136-TS of the spacer structure 136' and a top surface 138-TS of the connecting vias 138.

Figure 18:
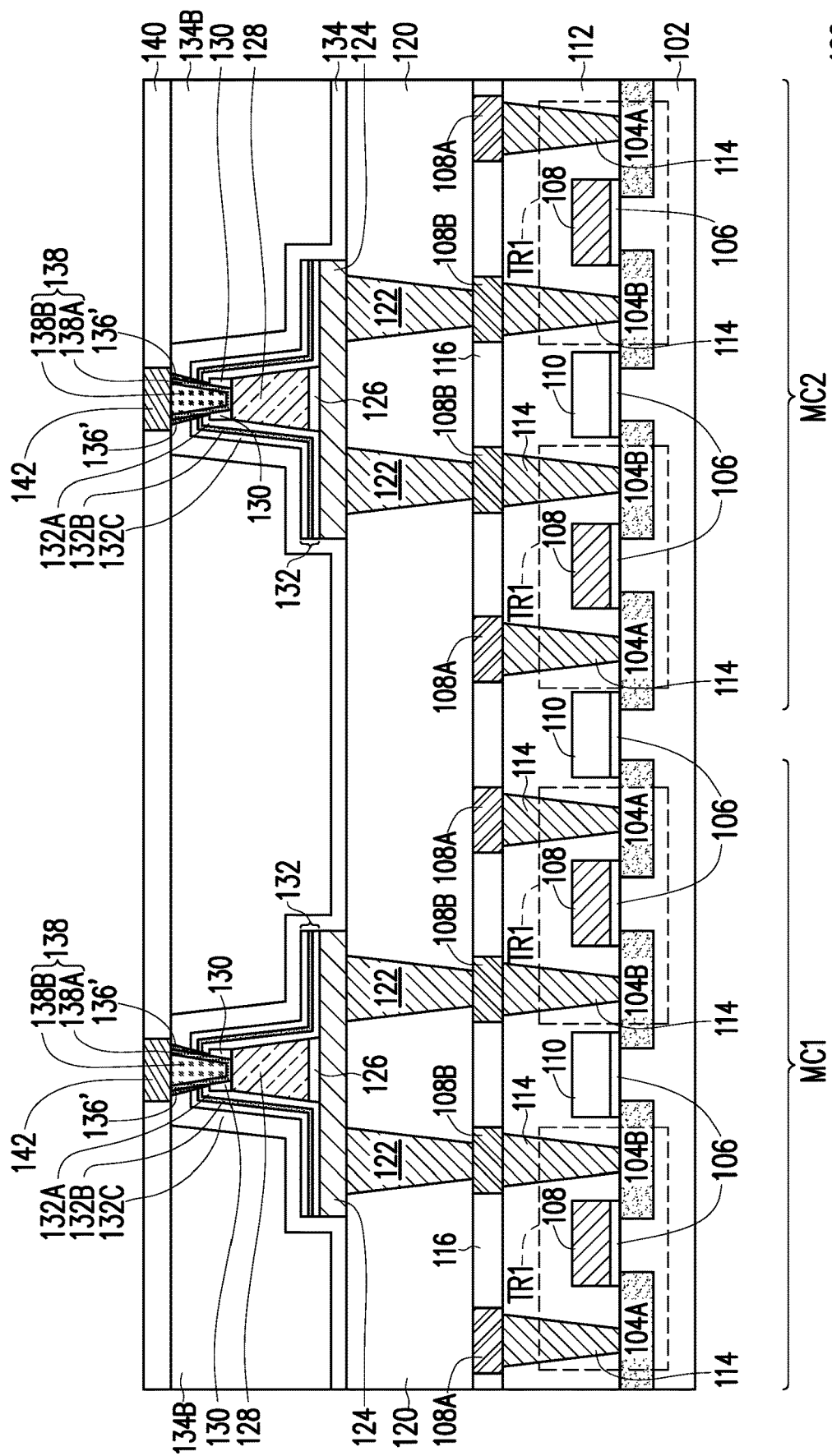

Referring to FIG. 18, in a subsequent step, a dielectric layer 140 may be formed over the interlayer dielectric (134, 134B), and conductive lines 142 may be formed in the dielectric layer 140. For example, the dielectric layer 140 may be patterned to form openings, while the conductive lines 142 are filled in the openings to be electrically connected to the connecting vias 138. In some embodiments, the conductive lines 142 provide electrical routing within the memory device to the bit lines (not shown). In some embodiments, the dielectric layer 140 may be a material similar to those described above for the interlayer dielectric (134, 134B), and may be deposited using similar techniques.

Up to here, a memory device 100 in accordance with some embodiments of the present disclosure is accomplished. In the memory device 100, during a programming operation, write transistors and read transistors of the transistors TR1 of a selected memory cell (MC1 and MC2) are both turned on, and a write current may flow through the transistors TR1 and the SOT layer 124 therebetween. As a result of spin orbit interaction, the write current flowing through the SOT layer 124 may induce a spin orbit torque on the MTJ film stack 128, thus the MTJ film stack 128 can be subjected to programming. The transistors TR1 (read and write transistors) are turned on by setting the corresponding word lines (gate electrodes 108), and the write current is provided by setting a voltage difference between the corresponding two of the source lines (conductive lines 108A). On the other hand, the bit line (connected to conductive lines 142) may be floated.

In some embodiments, during a read operation, the read transistors of the transistors TR1 of a selected memory cell (MC1 and MC2) are turned on, while the write transistors of the transistors TR1 in the same memory cell may be kept off. A voltage difference may be set between the bit line (connected to conductive lines 142) and the source line (conductive lines 108A) coupled with the read transistor (of the transistors TR1), thus a read current can flow through the MTJ film stack 128 connected between the read transistor (of transistors TR1) and the bit line. Due to a spin orbit coupling effect, different magnetization orientations of the MTJ film stack 128 (i.e., the parallel state and the anti-parallel state) may result in a change in an amount of scattering of conduction electrons traveling across the MTJ film stack 128. Such change leads to difference electrical resistances of the MTJ film stack 128, and may affect a value of the read current or a value of a voltage drop across the MTJ film stack 128. Therefore, the bit data (i.e., the resistance state) stored in the MTJ film stack 128 can be read out. On the other hand, the source line (conductive lines 108A) coupled with the write transistor (of transistors TR1) may be floated.

Furthermore, in the memory device 100, although two memory cells, such as a first memory cell MC1 and a second memory cell MC2 are illustrated herein, it is noted that the number of memory cells in the memory device 100 should be more than two, and this may be adjusted based on design requirements. In each of the memory cells (MC1, MC2), since the shielding structure 132 is laterally surrounding the MTJ film stack 128 or isolating the MTJ film stack 128, the shielding structure 132 can sustain external magnetic field over 1,000 Oe (oersted), which leaves a relatively small magnetic field of less than 100 Oe in the cell space of the MTJ film stack 128. As such, the disturbance of external magnetic field on the memory state of the memory cells (MC1, MC2) may be omitted, and bit error rates (BER) during retention and operations of the memory cells may be reduced. Overall, the shielding structure 132 forms a closed, enveloped surface covering the MTJ film stack 128 so that the spatial magnetic flux can be re-directed to flow through the designed shielding structure 132, which provides an improved shielding solution in the memory device 100.

Figure 19:
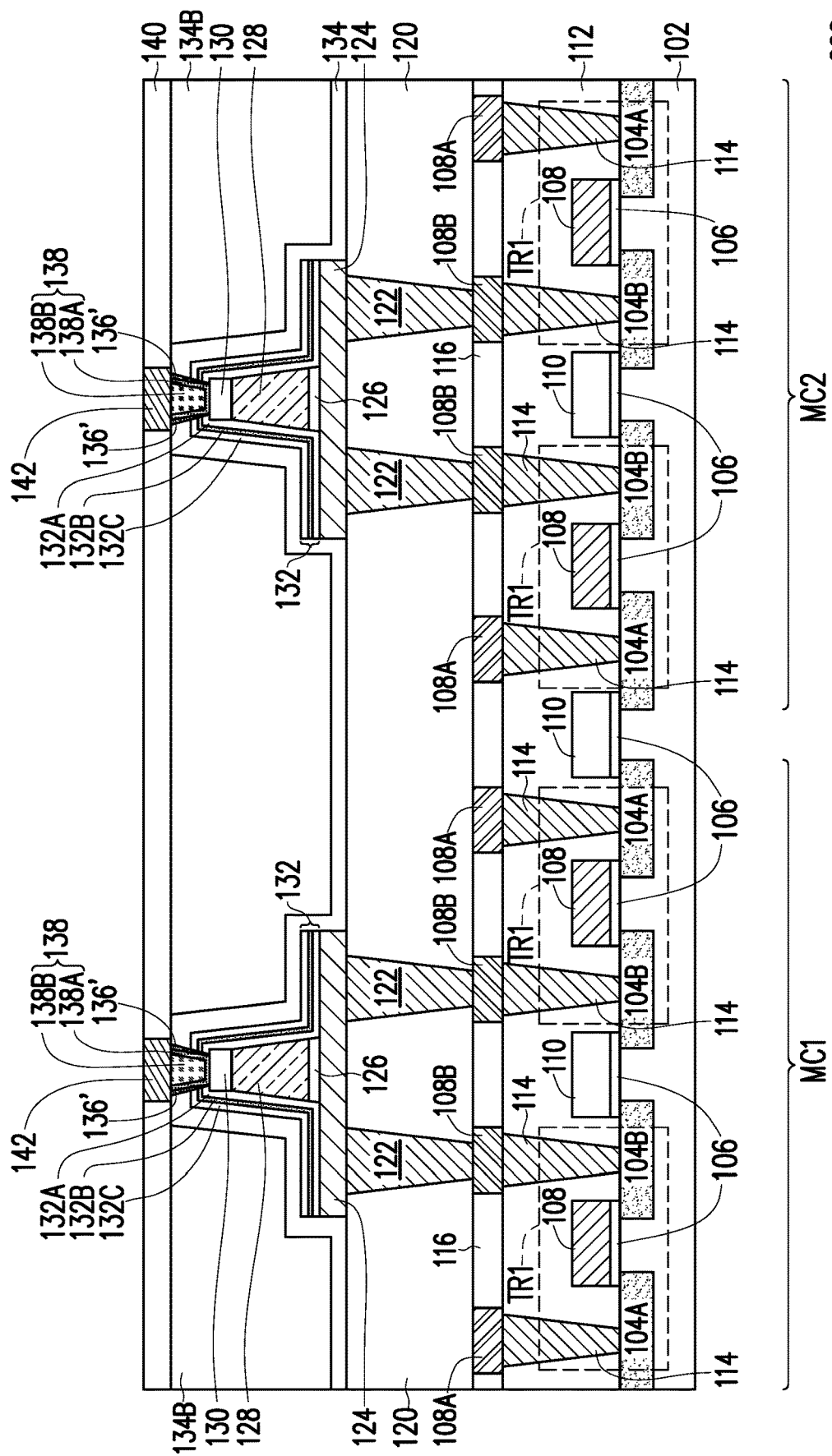
FIG. 19 is a schematic sectional view of a memory device according to some other embodiments of the present disclosure.

FIG. 19 is a schematic sectional view of a memory device according to some other embodiments of the present disclosure. The memory device 200 illustrated in FIG. 19 is similar to the memory device 100 illustrated in FIG. 18. Therefore, the same reference numerals are used to refer to the same or liked parts, and its detailed description will be omitted herein. The difference between the embodiments is that the hard mask layer 130 in FIG. 19 is not patterned. For example, in the exemplary embodiment, the hard mask layer 130 is a metal hard mask made of materials such as TiN, TaN, or the like. As such, the connecting vias 138 may be electrically connected to the MTJ film stack 128 through the hard mask layer 130 (metal hard mask).

In the illustrated embodiment, the first dielectric layer 132A of the shielding structure 132 is covering and contacting sidewalls of the spacer layer 126, sidewalls of the MTJ film stack 128 and sidewalls of the hard mask layer 130, while the first dielectric layer 132A is partially covering and contacting a top surface of the hard mask layer 130. Furthermore, the connecting vias 138 is laterally surrounded by the spacer structure 136', while the spacer structure 136' is partially surrounded by the shielding structure 132 and partially surrounded by the dielectric layer 134.

Similar to the above embodiments, In the memory device 200, since the shielding structure 132 is laterally surrounding the MTJ film stack 128 or isolating the MTJ film stack 128, the shielding structure 132 can sustain external magnetic field over 1,000 Oe (oersted), which leaves a relatively small magnetic field of less than 100 Oe in the cell space of the MTJ film stack 128. As such, the disturbance of external magnetic field on the memory state of the memory cells (MC1, MC2) may be omitted, and bit error rates (BER) during retention and operations of the memory cells may be reduced. Overall, the shielding structure 132 forms a closed, enveloped surface covering the MTJ film stack 128 so that the spatial magnetic flux can be re-directed to flow through the designed shielding structure 132, which provides an improved shielding solution in the memory device 200.

Figure 20:
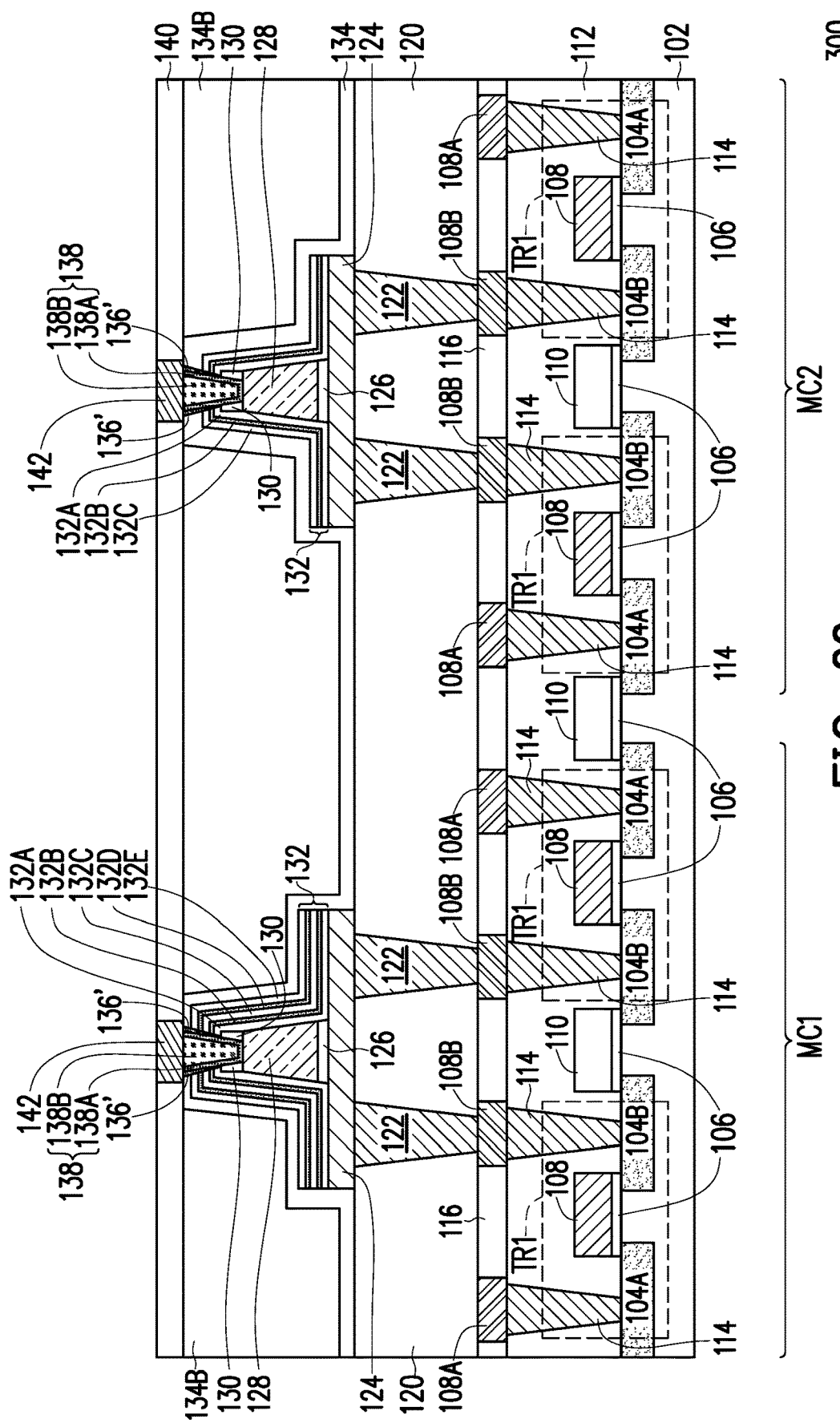
FIG. 20 is a schematic sectional view of a memory device according to some other embodiments of the present disclosure.

FIG. 20 is a schematic sectional view of a memory device according to some other embodiments of the present disclosure. The memory device 300 illustrated in FIG. 20 is similar to the memory device 100 illustrated in FIG. 18. Therefore, the same reference numerals are used to refer to the same or liked parts, and its detailed description will be omitted herein. The difference between the embodiments is in the design of the shielding structure 132 in the memory cell MC1.

As illustrated in FIG. 20, the shielding structure 132 in the memory cell MC1 may further include an auxiliary high magnetic permeability layer 132D disposed on the second dielectric layer 132C, and a third dielectric layer 132E disposed on the auxiliary high magnetic permeability layer 132D. For example, the auxiliary high magnetic permeability layer 132D is sandwiched between the second dielectric layer 132C and the third dielectric layer 132E. In some embodiments, the auxiliary high magnetic permeability layer 132D is disposed on the second dielectric layer 132C, and laterally surrounding the second dielectric layer 132C, the high magnetic permeability layer 132B, the first dielectric layer 132A and the MTJ film stack 128. Furthermore, the third dielectric layer 132E is disposed on the auxiliary high magnetic permeability layer 132D, and laterally surrounding the auxiliary high magnetic permeability layer 132D, the second dielectric layer 132C, the high magnetic permeability layer 132B, the first dielectric layer 132A and the MTJ film stack 128.

The auxiliary high magnetic permeability layer 132D is a material having high magnetic permeability, such as a material selected from the group consisting of Fe, $Ni_{0.8}Fe_{0.2}$, $Ni_{0.77}Fe_{0.16}Co_{0.05}Mo_{0.02}$, $Ni_{0.77}Fe_{0.16}Co_{0.005}Cr_{0.02}$, and $Co_{1-x}Fe_x$, and wherein $0.05<x<0.95$. Furthermore, the third dielectric layer 132E is made of dielectric materials such as silicon carbide, silicon oxycarbide, silicon oxide, silicon oxynitride, silicon carboxynitride, other suitable dielectric materials, or the like. The third dielectric layer 132E and the auxiliary high magnetic permeability layer 132D may be formed by suitable deposition process, such as spin coating, physical vapor deposition (PVD), chemical vapor deposition (CVD), the like, or a combination thereof.

In the exemplary embodiment, the first memory cell MC1 and the second memory cell MC2 are shown to have different designs of the shielding structure 132. However, the disclosure is not limited thereto, and each of the memory cells in the memory device 300 may be the same or different. For example, the memory cells may have a shielding structure 132 that includes the five-layered structure (132A-132E) or includes the three-layered structure (132A-132C) as mentioned above.

Similar to the above embodiments, In the memory device 300, since the shielding structure 132 is laterally surrounding the MTJ film stack 128 or isolating the MTJ film stack 128, the shielding structure 132 can sustain external magnetic field over 1,000 Oe (oersted), which leaves a relatively small magnetic field of less than 100 Oe in the cell space of the MTJ film stack 128. As such, the disturbance of external magnetic field on the memory state of the memory cells (MC1, MC2) may be omitted, and bit error rates (BER) during retention and operations of the memory cells may be reduced. Overall, the shielding structure 132 forms a closed, enveloped surface covering the MTJ film stack 128 so that the spatial magnetic flux can be re-directed to flow through the designed shielding structure 132, which provides an improved shielding solution in the memory device 300.

Figure 21:
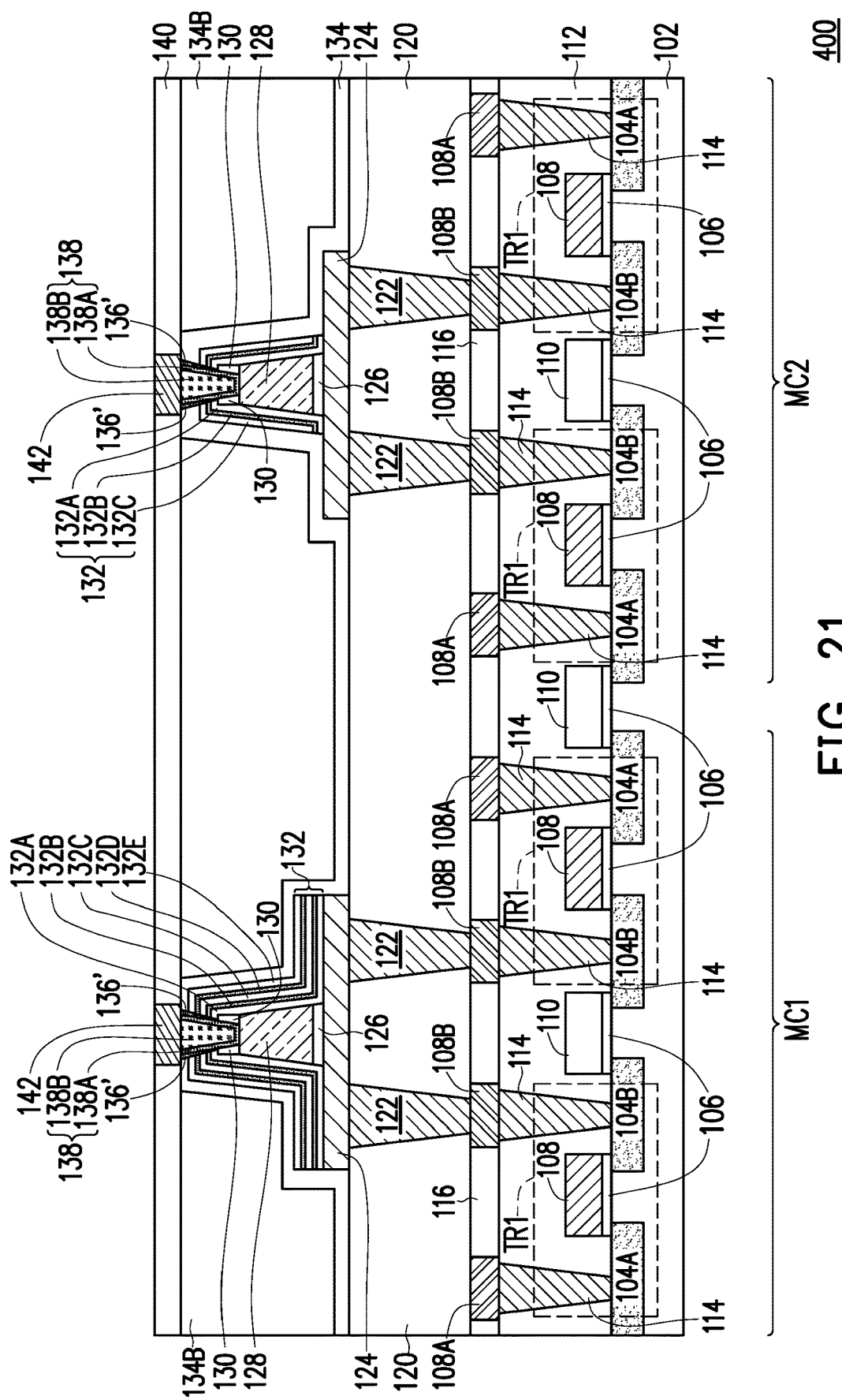
FIG. 21 is a schematic sectional view of a memory device according to some other embodiments of the present disclosure.

FIG. 21 is a schematic sectional view of a memory device according to some other embodiments of the present disclosure. The memory device 400 illustrated in FIG. 21 is similar to the memory device 300 illustrated in FIG. 20. Therefore, the same reference numerals are used to refer to the same or liked parts, and its detailed description will be omitted herein. The difference between the embodiments is in the design of the shielding structure 132 in the memory cell MC2.

As illustrated in FIG. 21, in some embodiments, the flank portions 132-FR (see FIG. 10) are omitted from the shielding structure 132 in the memory cell MC2. In other words, the shielding structure 132 includes the barrier portion 132-BR surrounding the MTJ film stack 128, while top surface of the SOT layer 124 is partially revealed by the shielding structure 132. In such embodiment, the dielectric layer 134 (or interlayer dielectric) is formed to cover and contact the top surface of the SOT layer 124, while the dielectric layer 134 laterally surround and contact sidewalls of the shielding structure 132. In certain embodiments, the first dielectric layer 132A may be contacting the top surface of the SOT layer 124 while surrounding the MTJ film stack 128. Furthermore, sidewalls of the first dielectric layer 132A may be aligned with sidewalls of the high magnetic permeability layer 132B and sidewalls of the second dielectric layer 132C In the exemplary embodiment, the first memory cell MC1 and the second memory cell MC2 are shown to have different designs of the shielding structure 132. However, the disclosure is not limited thereto, and each of the memory cells in the memory device 400 may be the same or different. For example, the memory cells may have a shielding structure 132 that includes the flank portions 132-FR as mentioned above, or where the flank portions 132-FR are removed from the shielding structure 132.

Similar to the above embodiments, In the memory device 400, since the shielding structure 132 is laterally surrounding the MTJ film stack 128 or isolating the MTJ film stack 128, the shielding structure 132 can sustain external magnetic field over 1,000 Oe (oersted), which leaves a relatively small magnetic field of less than 100 Oe in the cell space of the MTJ film stack 128. As such, the disturbance from external magnetic field on the memory state of the memory cells (MC1, MC2) may be omitted, and bit error rates (BER) during retention and operations of the memory cells may be reduced. Overall, the shielding structure 132 forms a closed, enveloped surface covering the MTJ film stack 128 so that the spatial magnetic flux can be re-directed to flow through the designed shielding structure 132, which provides an improved shielding solution in the memory device 400.

In the above-mentioned embodiments, the memory device includes at least a shielding structure that is laterally surrounding the MTJ film stack. As such, the shielding structure can form a closed, enveloped surface covering the MTJ film stack so that the spatial magnetic flux can be re-directed to flow through the designed shielding structure, which provides an improved shielding solution. Overall, the bit error rates (BER) during retention and operations of the memory cells may be reduced, and the performance of the memory device may be improved.

In accordance with some embodiments of the present disclosure, a memory device includes a substrate, a spin-orbit torque (SOT) layer, a magnetic tunneling junction (MTJ) film stack, a connecting via and a shielding structure. The SOT layer is disposed on the substrate. The MTJ film stack is formed over SOT layer and on the substrate. The connecting via is disposed on and electrically connected to the MTJ film stack. The shielding structure is laterally surrounding the MTJ film stack and disposed on the SOT layer, wherein the shielding structure includes a first dielectric layer, a high magnetic permeability layer and a second dielectric layer, the first dielectric layer is in contact with the SOT layer and the MTJ film stack, and the high magnetic permeability layer is sandwiched between the first dielectric layer and the second dielectric layer.

In accordance with some other embodiments of the present disclosure, a memory device includes a plurality of transistors, a plurality of conductive vias, a spin-orbit torque (SOT) layer, a magnetic tunneling junction (MTJ) film stack, a shielding structure, and a connecting via. The transistors are disposed on a substrate. The conductive vias are electrically coupled to the transistors. The SOT layer is disposed on and electrically coupled to the conductive vias. The MTJ film stack is disposed on the SOT layer. The shielding structure is covering the MTJ film stack and includes a first dielectric layer, a high magnetic permeability layer and a second dielectric layer. The first dielectric layer is disposed on the SOT layer and laterally surrounding and covering the MTJ film stack. The high magnetic permeability layer is disposed on the first dielectric layer and laterally surrounding the first dielectric layer and the MTJ film stack. The second dielectric layer is disposed on the high magnetic permeability layer and laterally surrounding the high magnetic permeability layer, the first dielectric layer and the MTJ film stack. The connecting via is disposed on and electrically connected to the MTJ film stack, wherein the connecting via is partially surrounded by the shielding structure.

In accordance with yet another embodiment of the present disclosure, a method of fabricating a memory device is described. The method includes the following steps. A substrate is provided. A spin-orbit torque (SOT) layer is formed on the substrate. A magnetic tunneling junction (MTJ) film stack is formed over the SOT layer and on the substrate. A shielding structure is formed to laterally surround the MTJ film stack and formed on the SOT layer, wherein the shielding structure includes a first dielectric layer, a high magnetic permeability layer and a second dielectric layer, the first dielectric layer is in contact with the SOT layer and the MTJ film stack, and the high magnetic permeability layer is sandwiched between the first dielectric layer and the second dielectric layer. A connecting via is formed on and electrically connected to the MTJ film stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   a spin-orbit torque layer disposed on the substrate;
   a magnetic tunneling junction (MTJ) film stack formed over the spin-orbit torque layer and on the substrate;
   a connecting via disposed on and electrically connected to the MTJ film stack; and
   a shielding structure laterally surrounding the MTJ film stack and disposed on the spin-orbit torque layer, wherein the shielding structure comprises a first dielectric layer, a high magnetic permeability layer and a second dielectric layer, the first dielectric layer is in contact with the spin-orbit torque layer and the MTJ film stack, and the high magnetic permeability layer is sandwiched between the first dielectric layer and the second dielectric layer.

2. The memory device according to claim 1, wherein the high magnetic permeability layer is a material selected from the group consisting of Fe, $Ni_{0.8}Fe_{0.2}$, $Ni_{0.77}Fe_{0.16}Co_{0.05}Mo_{0.02}$, $Ni_{0.77}Fe_{0.16}Co_{0.005}Cr_{0.02}$, and $Co_{1-x}Fe_x$, and wherein $0.05<x<0.95$.

3. The memory device according to claim 1, wherein sidewalls of the spin-orbit torque layer are aligned with sidewalls of the first dielectric layer, the high magnetic permeability layer and the second dielectric layer.

4. The memory device according to claim 1, wherein the shielding structure partially surround the connecting via, and a spacer structure is located in between the shielding structure and the connecting via.

5. The memory device according to claim 4, wherein the spacer structure is covering and contacting sidewalls of the connecting via, and the first dielectric layer, the high magnetic permeability layer and the second dielectric layer of the shielding structure are contacting sidewalls of the spacer structure.

6. The memory device according to claim 1, further comprising:
   a spacer layer located in between the MTJ film stack and the spin-orbit torque layer; and
   a hard mask layer located on top of the MTJ film stack, wherein the shielding structure is laterally surrounding the spacer layer, the MTJ film stack and the hard mask layer.

7. The memory device according to claim 1, wherein the shielding structure further comprises:
   an auxiliary high magnetic permeability layer disposed on the second dielectric layer; and
   a third dielectric layer disposed on the auxiliary high magnetic permeability layer, wherein the auxiliary high magnetic permeability layer is sandwiched between the second dielectric layer and the third dielectric layer.

8. The memory device according to claim 1, further comprising an interlayer dielectric surrounding the spin-orbit torque layer, the MTJ film stack, the shielding structure and the connecting via.

9. A memory device, comprising:
   a plurality of transistors disposed on a substrate;
   a plurality of conductive vias electrically coupled to the plurality of transistors;
   a spin-orbit torque layer disposed on and electrically coupled to the plurality of conductive vias;
   a magnetic tunneling junction (MTJ) film stack disposed on the spin-orbit torque layer;
   a shielding structure covering the MTJ film stack, wherein the shielding structure comprises:
      a first dielectric layer disposed on the spin-orbit torque layer and laterally surrounding and covering the MTJ film stack;
      a high magnetic permeability layer disposed on the first dielectric layer and laterally surrounding the first dielectric layer and the MTJ film stack; and
      a second dielectric layer disposed on the high magnetic permeability layer and laterally surrounding the high magnetic permeability layer, the first dielectric layer and the MTJ film stack;
   a connecting via disposed on and electrically connected to the MTJ film stack, wherein the connecting via is partially surrounded by the shielding structure.

10. The memory device according to claim 9, wherein the shielding structure includes a barrier portion and a flank portion, the barrier portion is covering sidewalls of the MTJ film stack, and the flank portion is connected to the barrier portion, and extends from the barrier portion towards sidewalls of the spin-orbit torque layer.

11. The memory device according to claim 10, wherein sidewalls of the flank portion are aligned with the sidewalls of the spin-orbit torque layer.

12. The memory device according to claim 10, further comprising a spacer structure located in between the connecting via and the barrier portion of the shielding structure, wherein the spacer structure is contacting sidewalls of the connecting via, and a top surface of the spacer structure is aligned with a top surface of the connecting via.

13. The memory device according to claim 9, further comprising:
   a spacer layer located in between the MTJ film stack and the spin-orbit torque layer; and
   a hard mask layer located on top of the MTJ film stack, wherein the shielding structure is laterally surrounding the spacer layer, the MTJ film stack and the hard mask layer.

14. The memory device according to claim 13, wherein the first dielectric layer of the shielding structure is covering and contacting sidewalls of the spacer layer, sidewalls of the MTJ film stack and sidewalls of the hard mask layer, and the first dielectric layer is partially covering and contacting a top surface of the hard mask layer.

15. The memory device according to claim 9, wherein the shielding structure further comprises:
   an auxiliary high magnetic permeability layer disposed on the second dielectric layer, and laterally surrounding the second dielectric layer, the high magnetic permeability layer, the first dielectric layer and the MTJ film stack; and
   a third dielectric layer disposed on the auxiliary high magnetic permeability layer, and laterally surrounding the auxiliary high magnetic permeability layer, the second dielectric layer, the high magnetic permeability layer, the first dielectric layer and the MTJ film stack.

16. A method of fabricating a memory device, comprising:
   providing a substrate;
   forming a spin-orbit torque layer on the substrate;
   forming a magnetic tunneling junction (MTJ) film stack over the spin-orbit torque layer and on the substrate;
   forming a shielding structure laterally surrounding the MTJ film stack and on the spin-orbit torque layer, wherein the shielding structure comprises a first dielectric layer, a high magnetic permeability layer and a second dielectric layer, the first dielectric layer is in contact with the spin-orbit torque layer and the MTJ film stack, and the high magnetic permeability layer is sandwiched between the first dielectric layer and the second dielectric layer; and forming a connecting via disposed on and electrically connected to the MTJ film stack.

17. The method according to claim 16, wherein forming the shielding structure comprises sequentially forming the first dielectric layer, the high magnetic permeability layer and the second dielectric layer on the spin-orbit torque layer and over the MTJ film stack, and wherein the shielding structure and the spin-orbit torque layer are patterned together so that sidewalls of the spin-orbit torque layer are aligned with sidewalls of the first dielectric layer, the high magnetic permeability layer and the second dielectric layer.

18. The method according to claim 16, further comprising:

patterning the shielding structure to form an opening over the MTJ film stack prior to forming the connecting via;

forming a spacer structure in the opening over the MTJ film stack; and forming the connective via in the opening and over the MTJ film stack, wherein the spacer structure is located in between the shielding structure and the connecting via.

19. The method according to claim 16, further comprising:

forming a spacer layer on the spin-orbit torque layer prior to forming the MTJ film stack;

forming the MTJ film stack on the spacer layer over the spin-orbit torque layer; and forming a hard mask layer on top of the MTJ film stack, wherein the shielding structure is formed to laterally surround the spacer layer, the MTJ film stack and the hard mask layer.

20. The method according to claim 16, wherein forming the shielding structure further comprises:

forming an auxiliary high magnetic permeability layer on the second dielectric layer; and forming a third dielectric layer disposed on the auxiliary high magnetic permeability layer, wherein the auxiliary high magnetic permeability layer is sandwiched between the second dielectric layer and the third dielectric layer.

* * * * *